(12) United States Patent
Davis et al.

(10) Patent No.: US 11,749,534 B1
(45) Date of Patent: Sep. 5, 2023

(54) QUAD FLAT NO-LEAD (QFN) PACKAGE WITHOUT LEADFRAME AND DIRECT CONTACT INTERCONNECT BUILD-UP STRUCTURE AND METHOD FOR MAKING THE SAME

(71) Applicant: Deca Technologies USA, Inc., Tempe, AZ (US)

(72) Inventors: Robin Davis, Vancouver, WA (US); Paul R. Hoffman, San Diego, CA (US); Clifford Sandstrom, Richfield, MN (US); Timothy L. Olson, Phoenix, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 17/957,683

(22) Filed: Sep. 30, 2022

Related U.S. Application Data

(60) Provisional application No. 63/391,315, filed on Jul. 21, 2022.

(51) Int. Cl.
    *H01L 21/48*     (2006.01)
    *H01L 21/56*     (2006.01)
    *H01L 23/00*     (2006.01)

(52) U.S. Cl.
    CPC ........ *H01L 21/4839* (2013.01); *H01L 21/561* (2013.01); *H01L 21/568* (2013.01); *H01L 24/13* (2013.01); *H01L 24/16* (2013.01); *H01L 24/81* (2013.01); *H01L 2224/13147* (2013.01); *H01L 2224/16245* (2013.01); *H01L 2224/81411* (2013.01); *H01L 2224/81424* (2013.01); *H01L 2224/81439* (2013.01);
(Continued)

(58) Field of Classification Search
None
See application file for complete search history.

(56) References Cited

U.S. PATENT DOCUMENTS 5,570,274 A    10/1996   Saito
5,790,384 A    8/1998   Ahmad
(Continued)

OTHER PUBLICATIONS

Kurita, Yoichiro et al. "Fan-Out WLP With Highly Flexible Design Capabilities." 3rd Electronic System-Integration Technology Conference (ESTC), Sep. 13-16, 2010.
(Continued)

*Primary Examiner* — Jay C Chang
(74) *Attorney, Agent, or Firm* — BOOTH UDALL FULLER, PLC; Bryce W. Burnham

(57) ABSTRACT

A method and related structure for a quad flat no-lead (QFN), dual flat no-lead (DFN) or small outline no-lead (SON) package without a leadframe. Disposing semiconductor chips face-up on a temporary carrier, disposing a first encapsulant layer around the semiconductor chip, the active layer and conductive stumps, forming a conductive layer and conductive contacts over the planar surface, disposing encapsulant over the first encapsulant layer, conductive layer and conductive contacts, forming a photoresist over the encapsulant with openings, forming conductive pads within the openings, forming a solderable metal system (SMS) or applying an organic solderability preservative (OSP) over the conductive pads, and cutting through the encapsulant around the chip to form the outline of a package.

29 Claims, 26 Drawing Sheets

(52) U.S. Cl.
CPC ............... *H01L 2224/81444* (2013.01); *H01L 2224/81447* (2013.01); *H01L 2224/81455* (2013.01); *H01L 2224/81457* (2013.01); *H01L 2224/81466* (2013.01); *H01L 2224/81469* (2013.01); *H01L 2224/81481* (2013.01); *H01L 2224/81484* (2013.01)

(56) References Cited

U.S. PATENT DOCUMENTS

| | | | |
|---|---|---|---|
| 6,133,626 | A | 10/2000 | Hawke |
| 6,294,406 | B1 | 9/2001 | Bertin |
| 7,569,422 | B2 | 8/2009 | Lin |
| 8,018,036 | B2 | 9/2011 | Goh et al. |
| 8,164,171 | B2 | 4/2012 | Lin |
| 8,503,186 | B2 | 8/2013 | Lin |
| 8,653,647 | B2 | 2/2014 | Masuda et al. |
| 8,664,044 | B2 | 3/2014 | Jin et al. |
| 8,804,360 | B2 | 8/2014 | Lin |
| 9,385,074 | B2 | 7/2016 | Pendse |
| 9,391,041 | B2 | 7/2016 | Lin |
| 9,553,000 | B2 | 1/2017 | Yu et al. |
| 9,601,463 | B2 | 3/2017 | Yu |
| 9,613,931 | B2 | 4/2017 | Lin |
| 9,793,231 | B2 | 10/2017 | Chen |
| 10,056,351 | B2 | 8/2018 | Yu |
| 10,229,892 | B2 | 3/2019 | Appelt |
| 10,325,879 | B2 | 6/2019 | Yu |
| 10,490,468 | B2 | 11/2019 | Tsai |
| 10,879,224 | B2 | 12/2020 | Chen |
| 11,024,605 | B2 | 6/2021 | Chen |
| 11,171,076 | B2 | 11/2021 | Yu |
| 11,211,360 | B2 | 12/2021 | Huang |
| 11,502,062 | B2 | 11/2022 | Chen |
| 2019/0333893 | A1 | 10/2019 | Yu |
| 2019/0341351 | A1 | 11/2019 | May et al. |
| 2021/0066263 | A1* | 3/2021 | Chen ............... H01L 23/3128 |
| 2021/0272929 | A1* | 9/2021 | Tsai .................. H01L 24/82 |
| 2022/0005760 | A1 | 1/2022 | Dadvand et al. |

OTHER PUBLICATIONS

Motohashi, Norikazu et al. "System in Wafer-Level Package Technology With RDL-First Process." Proceedings—Electronic Components and Technology Conference. 2011. pp. 59-64.

Braun, Tanja et al. "Fan-Out Wafer and Pane; Level Packaging as Packaging Platform for Heterogeneous Integration." Micromachines. 2019. vol. 10, pp. 342.

Jin, Yonggang et al. "Development and Characterization of Next Generation EWLB (Embedded Wafer Level BGA) Packaging." ECTC, 2012. pp. 1388-1393.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Jin, Yonggang et al. "Enhanced Fan-Out WLP for High Power Device Packaging." International Electronics Manufacturing Technology Conference (IEMT), 2012.

Anandan, Ramasamy et al. "Embedded Wafer Level BGA (EWLB)—Extra-Small and ELGA Packages." Electronics Packaging Technology Conference (EPTC), 2011. pp. 412-416.

Boettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Stahr, Hannes et al. "Embedded Components on the Way to Industrialisation." 2011. https://ats.net/wp-content/uploads/2017/03/SMTA_Austin_TX_2011_ECP_Paper.pdf.

\* cited by examiner

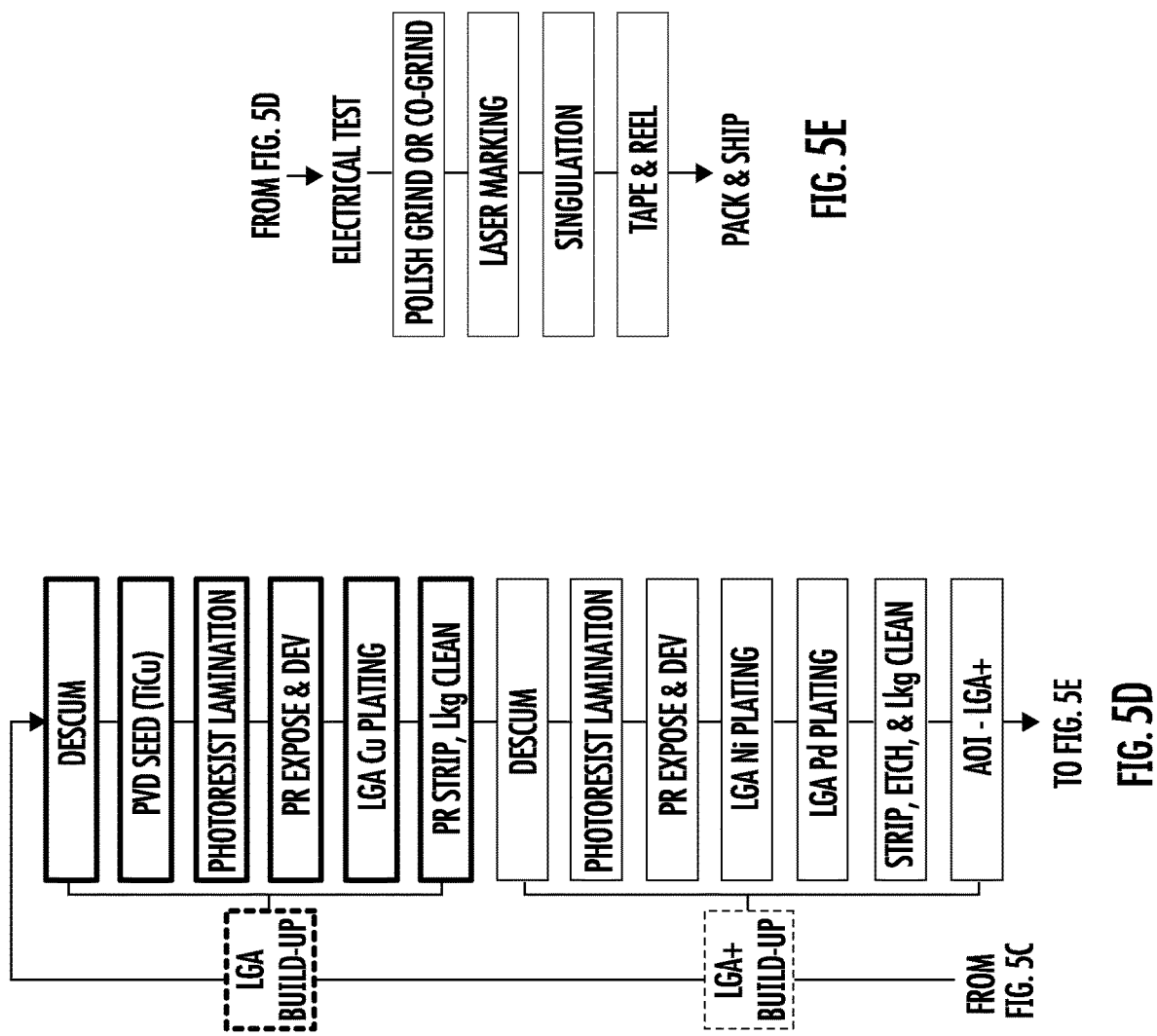

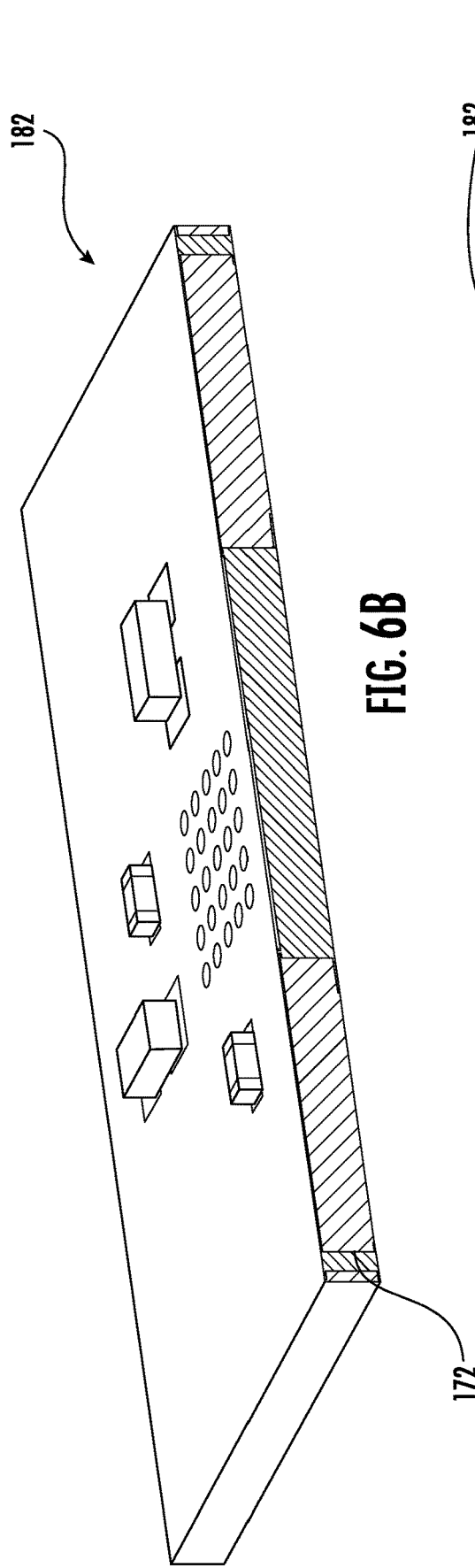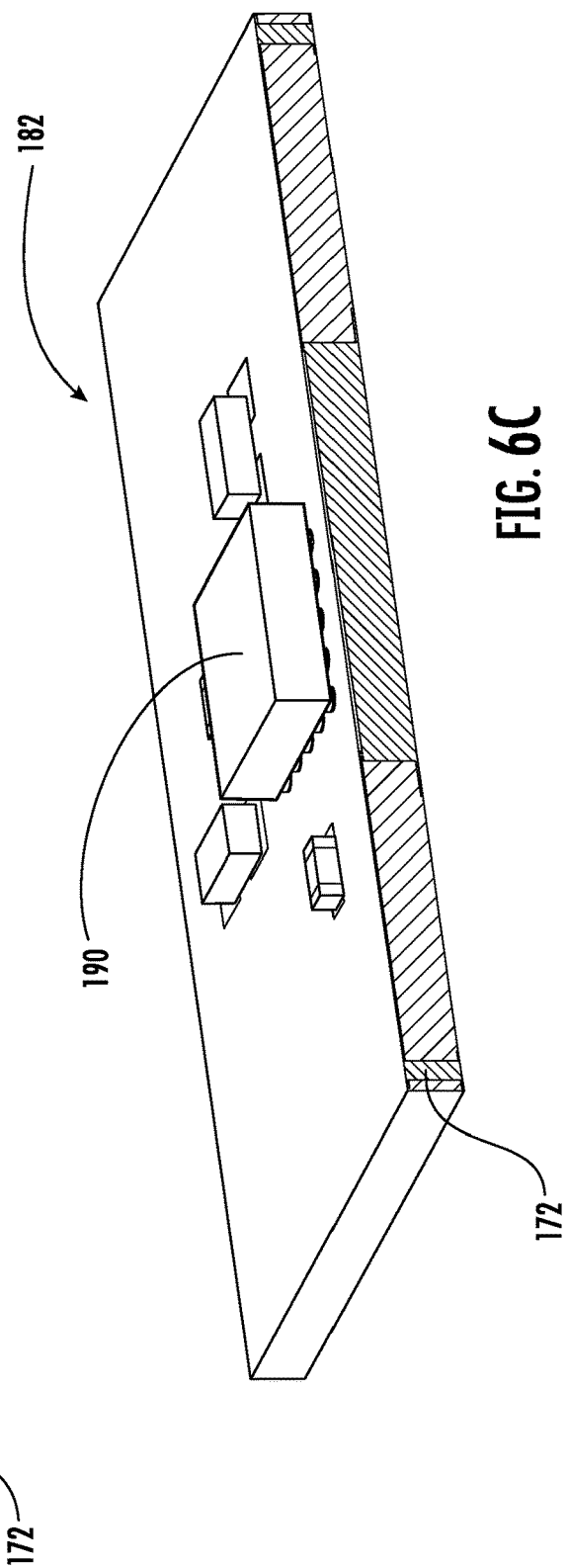

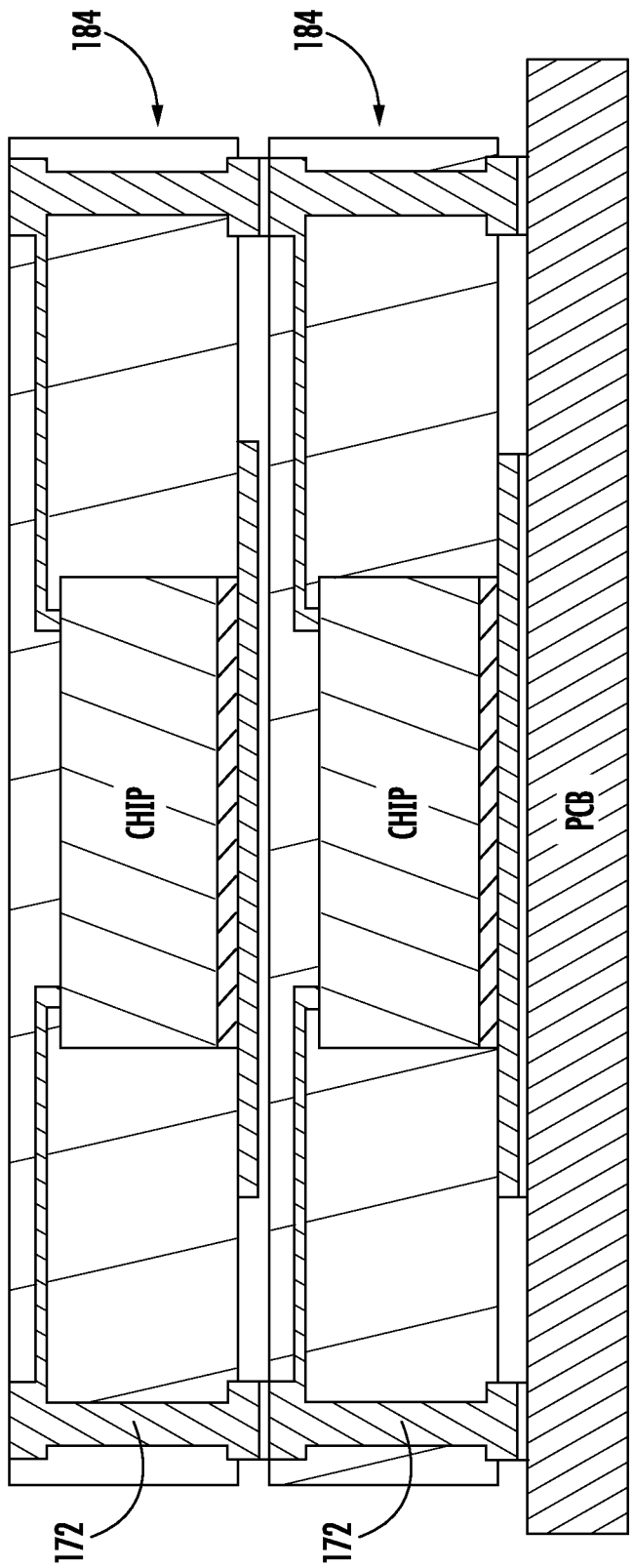

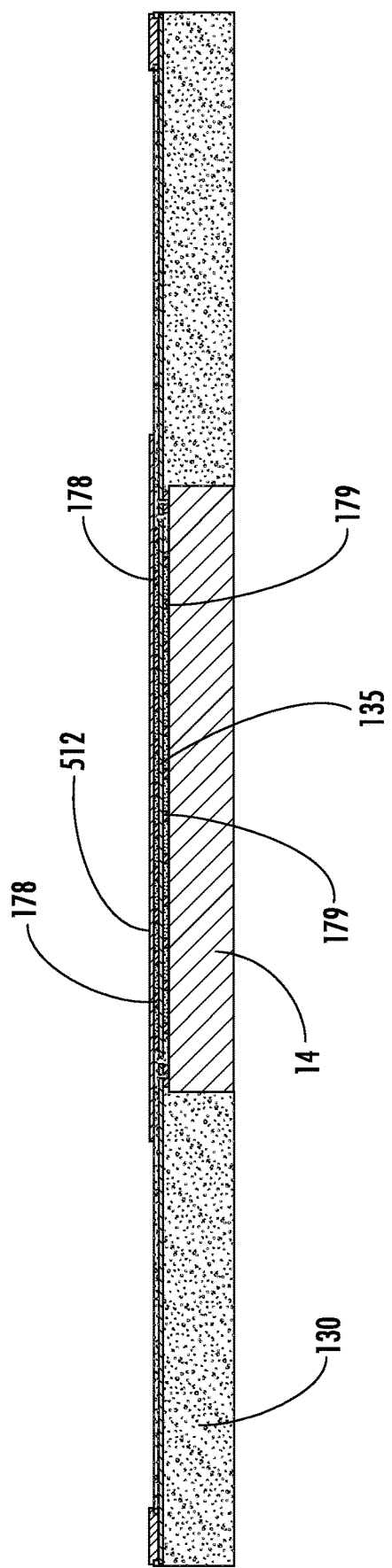

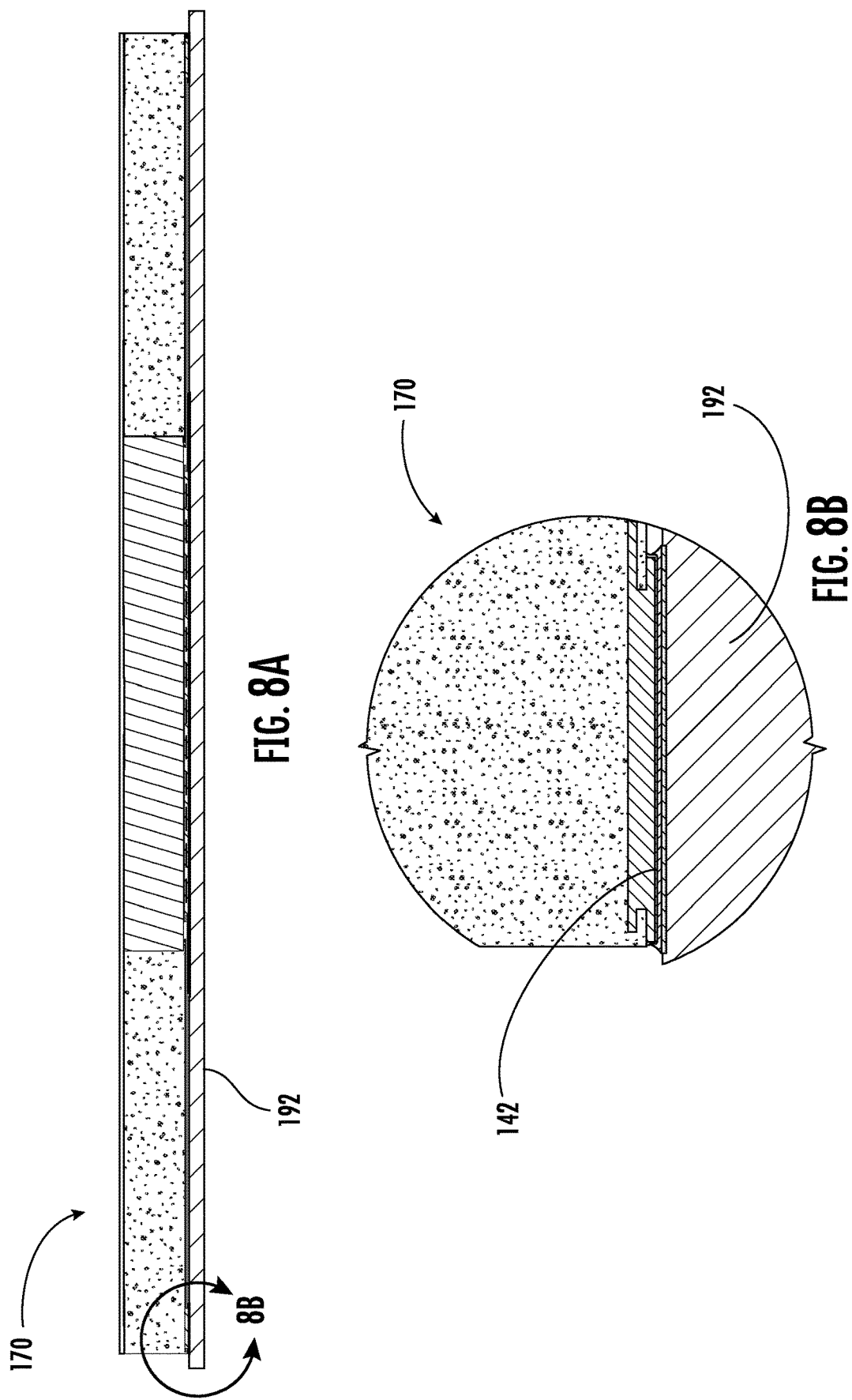

QUAD FLAT NO-LEAD (QFN) PACKAGE WITHOUT LEADFRAME AND DIRECT CONTACT INTERCONNECT BUILD-UP STRUCTURE AND METHOD FOR MAKING THE SAME

CROSS REFERENCE TO RELATED APPLICATIONS

This disclosure claims the benefit, including the filing date, of U.S. Provisional Patent Application No. 63/391,315 entitled "Quad Flat No-Lead (QFN) Package Without Leadframe and Direct Contact Interconnect Build-up Structure Without Capture Pads and Method for Making the Same" to Davis et al. that was filed on Jul. 21, 2022, the entire disclosure of which is hereby incorporated herein by this reference.

TECHNICAL FIELD

This disclosure concerns devices and methods of forming quad flat no-lead (QFN), dual flat no-lead (DFN) or small-outline no-lead (SON) semiconductor packaging without a leadframe and with molded direct contact interconnect build-up structures.

BACKGROUND

Semiconductor devices, packages, substrates, and interposers are commonly found in modern electronic products. Production of semiconductor devices involves a multistep build-up of components. Conventional interconnect structures alternate dielectric and conductive layers. An opening or via is created in the dielectric to allow connectivity from one layer to another. On the conductive layers, capture pads are required for the vias to correct for inconsistencies in manufacture. Use of these conventional capture pads impacts the ability to construct compact structures due to limits on routing density. Additionally, traditional manufacturing processes involve the use of leadframes that result in exposed leadframe ends on the sides of the packaging.

SUMMARY

An opportunity exists for improved packages, including applications for semiconductor manufacturing. Aspects of this document relate to a method of making a quad flat no-lead (QFN), dual flat no-lead (DFN) or small outline no-lead (SON) package without a leadframe, comprising disposing at least two semiconductor chips face-up on a temporary carrier, the at least two semiconductor chips each comprising conductive stumps over an active layer of the semiconductor chip, disposing a first encapsulant layer in a single step around four side surfaces of the semiconductor chip, over the active layer of the semiconductor chip, and around the conductive stumps, planarizing the encapsulant over an active layer of the semiconductor chip to create a planar surface comprising exposed ends of the conductive stumps and an exposed encapsulant surface, forming a first conductive layer and first vertical conductive contacts over the planar surface and configured to be electrically coupled with the conductive stumps of the semiconductor chip, disposing a second layer of encapsulant over the first encapsulant layer, the first conductive layer and the first vertical conductive contacts, forming a first photoresist over the second layer of encapsulant with openings formed through the first photoresist over the first vertical conductive contacts, forming conductive pads in the form of land pads or bumps within the openings and then removing the first photoresist, forming a second photoresist over the second layer of encapsulant with conductive pad openings formed through the second photoresist over the conductive pads, forming a solderable metal system (SMS) or applying an organic solderability preservative (OSP) over the conductive pads to resist oxidation over at least a portion of the conductive pads, and cutting through the encapsulant around the chip to form the outline of a package.

Particular embodiments may comprise one or more of the following features. The SMS is formed by a single layer or multi-material layer build-up of conductive material comprising at least one of a layer of nickel (Ni), a layer of silver (Ag), a layer of palladium (Pd), a layer of tin (Sn), and a layer of gold (Au). The SMS is formed as a layer of conductive materials over the conductive pads by one or more of electroplating, electroless plating, immersion plating, physical vapor deposition (PVD), and chemical vapor deposition (CVD). Forming the conductive pads comprises forming the conductive pad to include at least the second layer of encapsulant locked between the first conductive layer and the conductive pads. Forming the first conductive layer comprises forming a redistribution layer directly upon an encapsulant surface, and wherein disposing a second layer of encapsulant over the first conductive layer includes disposing the second layer of encapsulant directly upon the redistribution layer, wherein the encapsulant surface and the second layer of encapsulant are of the same kind of encapsulant. Forming a flag, mounting pads, identifying mark, alignment marks, or other conductive structure over the semiconductor chip and over the second layer of the encapsulant. The conductive pad extends beyond a surface edge of an uppermost encapsulant layer. Cutting through the encapsulant such that an edge or side of the conductive pad is inset from the resulting QFN, DFN or SON package edge. The encapsulant of at least one of the first layer of encapsulant and the second layer of encapsulant is not a polymer material and comprises a mold compound, polyimide or a composite material. Forming openings in the second photoresist layer around the conductive pads, the openings each comprising an offset between the conductive pad respective to the opening and an edge of the second photoresist. Forming the QFN, DFN or SON package without exposed copper. Forming the QFN, DFN or SON package without exposed copper on the periphery of the package. Forming at least one of a through mold post and a double-sided circuit trace in the QFN, DFN or SON package. Forming additional conductive stumps over the first layer of encapsulant.

Aspects of this disclosure relate to a method of making a quad flat no-lead (QFN), dual flat no-lead (DFN) or small outline no-lead (SON) package without a leadframe, the method comprising disposing a semiconductor chip face-up on a temporary carrier, the semiconductor chip comprising conductive stumps over an active layer of the semiconductor chip, disposing encapsulant in a single step around four side surfaces of the semiconductor chip, over the active layer of the semiconductor chip, and around at least a portion of sidewalls of the conductive stumps, planarizing a surface of the encapsulant and conductive stumps, forming conductive traces over the encapsulant, forming conductive pads over the encapsulant in the form of land pads or bumps, and forming a solderable metal system (SMS) or applying an organic solderability preservative (OSP) over the conductive pads to resist oxidation over at least a portion of the conductive pads.

Particular embodiments may comprise one or more of the following features. The SMS is formed by, electroplating, electroless plating, immersion plating, physical vapor deposition (PVD), or chemical vapor deposition (CVD), of conductive materials over the conductive pads. Forming conductive traces on the encapsulant comprises forming a redistribution layer directly upon an encapsulant surface, and further comprising disposing encapsulant directly upon the redistribution layer, wherein the encapsulant disposed in the single step and the encapsulant disposed directly upon the redistribution layer are of the same kind of encapsulant. Each conductive pad includes at least one layer of encapsulant locked between at least two layers of conductive material. Each conductive pad includes at least two layers of encapsulant interlocked between at least three layers of conductive material. The SMS is formed by a single layer or multi-material layer build-up of conductive material comprising at least one of a layer of nickel (Ni), a layer of silver (Ag), a layer of palladium (Pd), a layer of tin (Sn), and a layer of gold (Au). Forming a flag, mounting pads, identifying mark, alignment marks, or other conductive structure over the semiconductor chip and over the second layer of the encapsulant. The conductive pad extends beyond the surface of the final encapsulant. Cutting through the encapsulant such that an edge or side of the conductive pad is inset from the resulting QFN or SON package edge. Forming openings in a second photoresist layer around the conductive pads, the openings comprising an offset between the conductive pads and an edge of the second photoresist. Forming the QFN, DFN or SON package without exposed copper. Forming the QFN, DFN or SON package without exposed copper on the periphery of the package. Forming additional conductive stumps over the surface of the encapsulant. Forming at least one of a through mold post and a double-sided circuit trace in the QFN, DFN or SON package. The QFN or SON package includes no solder balls. Forming a plurality of dummy thermal conductive stumps over the active surface of the semiconductor chip and thermally coupling the dummy thermal conductive stumps with a thermally dissipative layer on the QFN, DFN or SON package.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

Implementations will hereinafter be described in conjunction with the appended drawings, where like designations denote like elements, and:

FIGS. 5A-5E are a flow diagram of a method of forming a QFN, DFN or SON package without a leadframe.

FIG. 6B is a perspective cross-sectional view of a QFN package with TMVs and devices mounted to the package and additional pads.

FIG. 6C is a perspective cross-sectional view of the QFN package of FIG. 6B with a semiconductor device mounted to the additional pads.

FIG. 6D is a side cross-sectional view of QFN, DFN or SON packages stacked on top of each other with TMCs, and mounted to a printed circuit board (PCB).

FIG. 7A illustrates a cross-sectional view of a QFN, DFN or SON package illustrating dummy thermally conductive stumps.

FIG. 8A is a side cross-sectional view of a QFN, DFN or SON package mounted to a PCB.

FIG. 8B is a close-up view of a portion of FIG. 8A identified as section 8B.

This disclosure, its aspects and implementations, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation.

DETAILED DESCRIPTION

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. Are illustrative representations and are not necessarily drawn to scale.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Figure 1B:
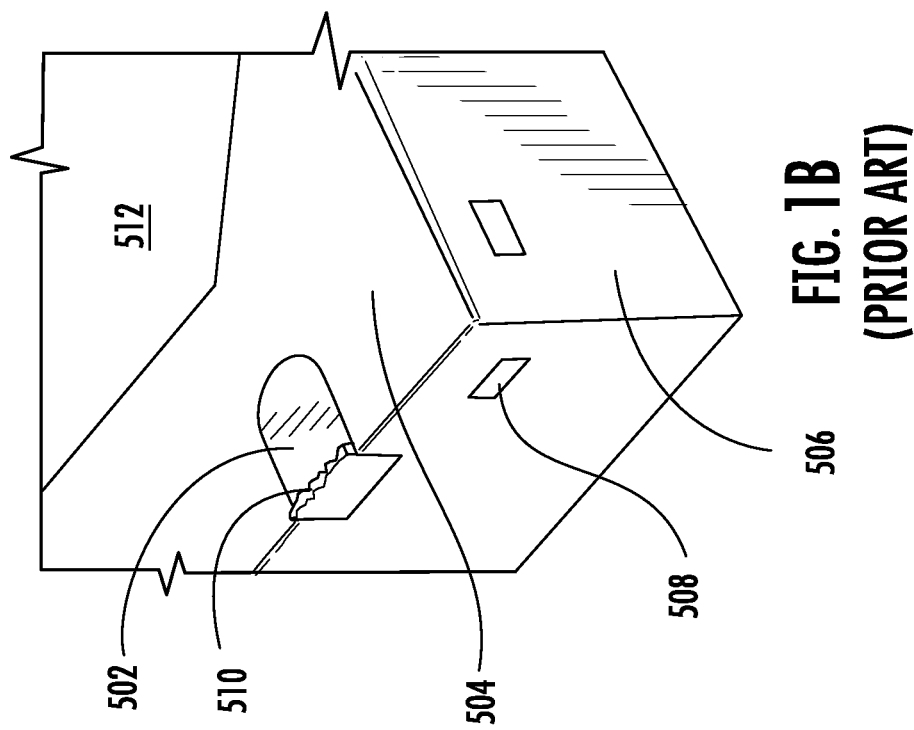
FIG. 1B is a close-up view of the QFN package of FIG. 1A.
Figure 1A:
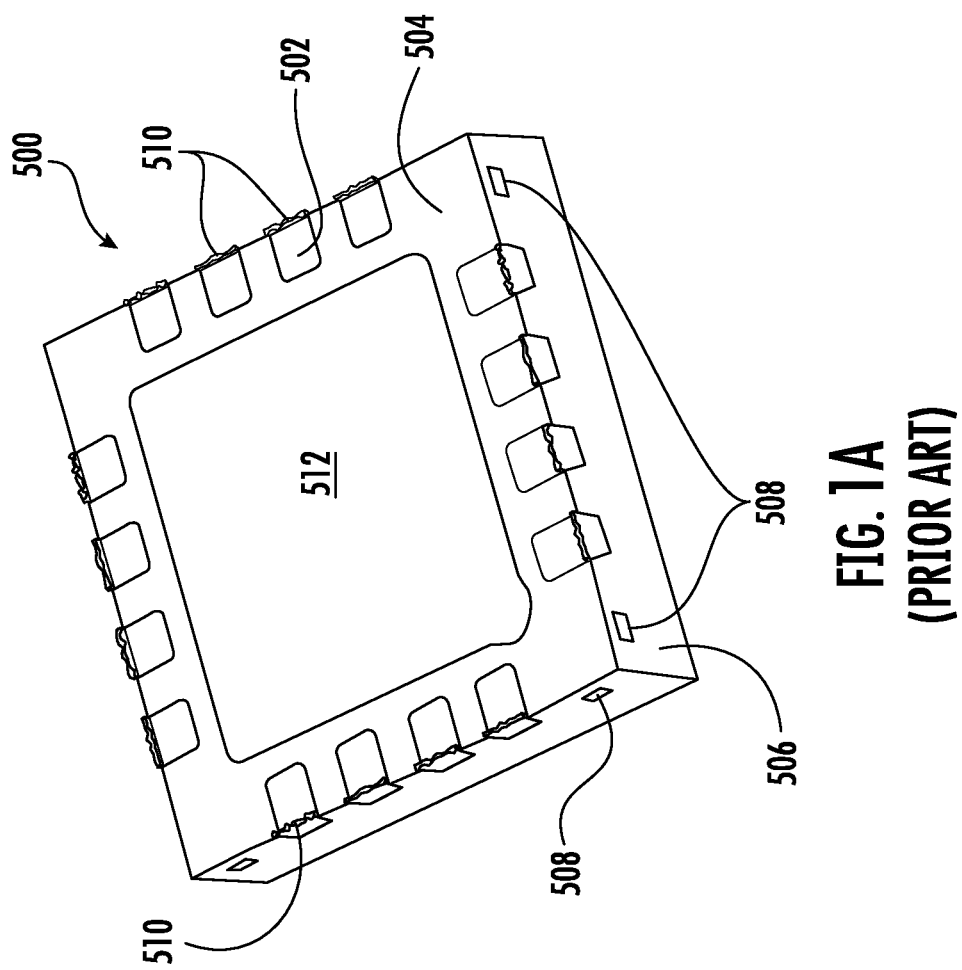
FIG. 1A is a perspective view of a prior art QFN package with a leadframe and tie bar ends.

This disclosure relates to a quad flat no-lead (QFN), dual flat no-lead (DFN) or small-outline no-lead (SON) package without a leadframe and with molded direct contact interconnect build-up structures, and a method of making the same. A QFN, DFN or SON is a small-sized integrated circuit (IC) package that offers small size, low cost, and very good performance. FIG. 1A, included illustrates an image of a conventional QFN package 500 with side lengths of 5 mm. Those of ordinary skill in the art are familiar with QFN, DFN and SON package structures.

No-lead packages such as QFN, DFN and SON packages physically and electrically connect to the surface of printed circuit boards (PCB's) or other substrates using surface mount technology, thus coupling the IC to the PCB or other substrate. In the surface mount technology illustrated in the conventional QFN package 500 of FIG. 1A and the close-up view in 1B, the land pads 502 are exposed on the upper surface 504 of the package 500 and on the side edges 506 of the package 506. In particular, a portion of the leadframe, called the tie bar 508, is cut and exposed along the side edges 506 during singulation of the packages. Additionally, when the packages 500 are cut during singulation, because the land pads extend to the edge 506 of the package 500, the saw creates a burr 510 that extends from the land pads 502 caused by the saw heat and rotation as it cuts along the edge of the land pads 502. This burring that extends in each of the X-, Y- and Z-planes is a known problem of QFN singulation and requires costly process measures to reduce them or additional processing to remove them.

Figure 1D:
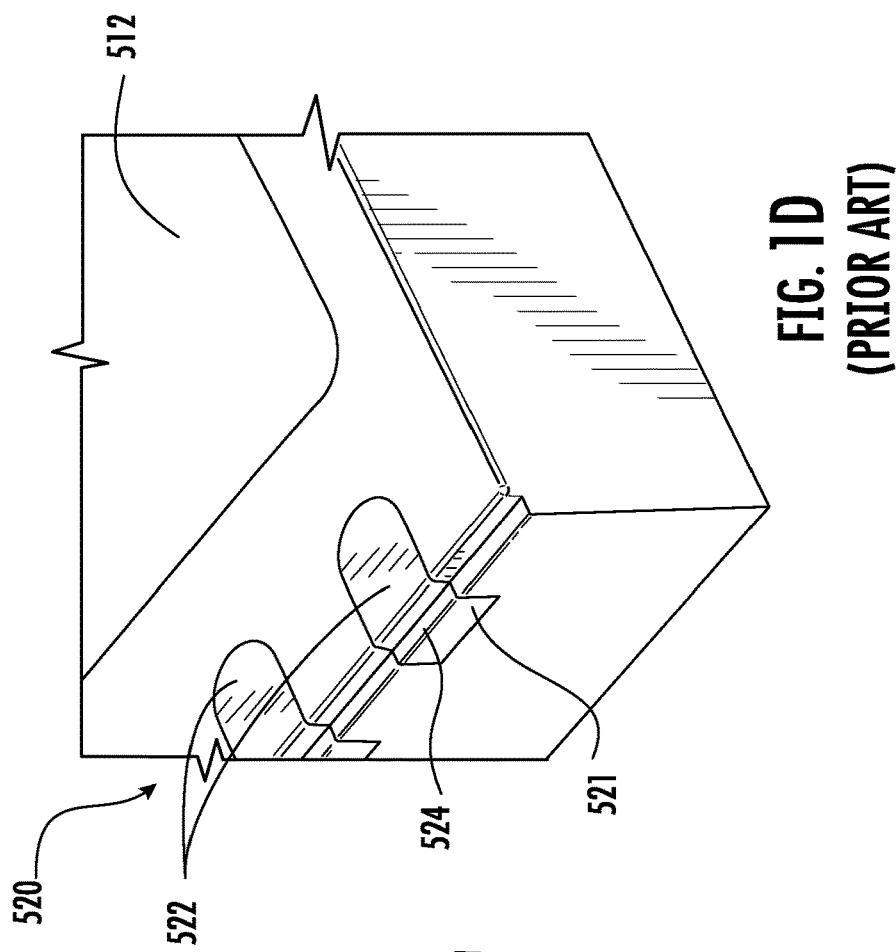
FIG. 1D is a close-up view of the QFN package of FIG. 1C.
Figure 1C:
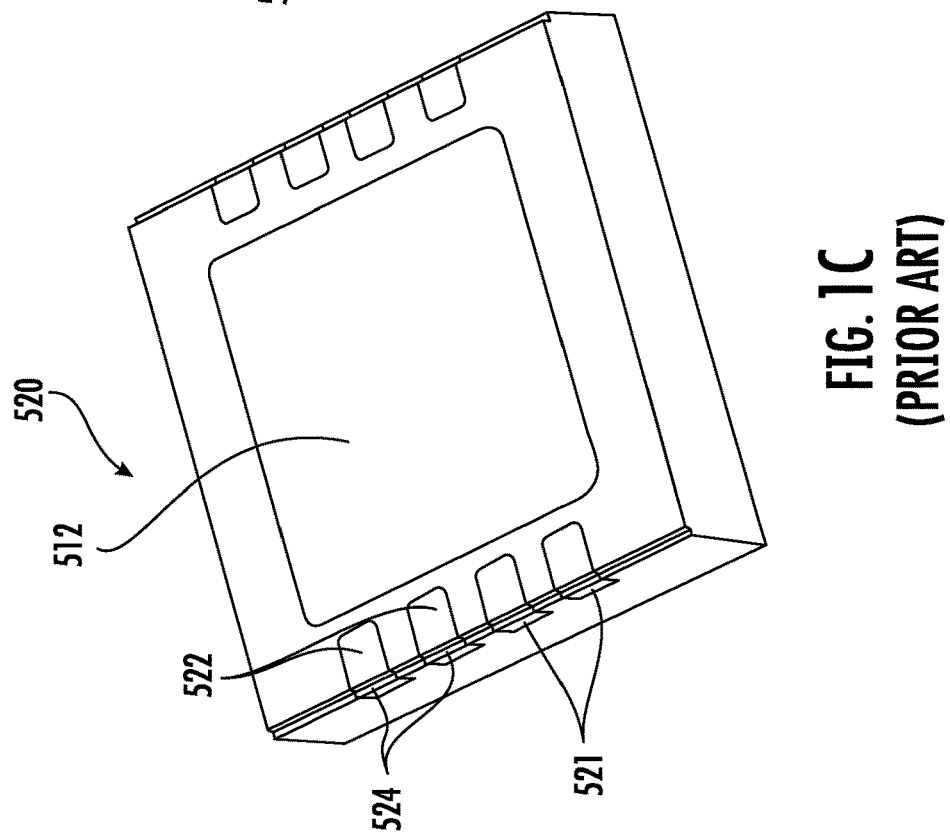
FIG. 1C is a perspective view of a prior art QFN package with a leadframe, tie bar ends and channel.

FIG. 1C, and close-up view in FIG. 1D, emphasize that in some conventional packages 520, a "wettable flank" or wettable vertical surface of a traditional QFN, DFN or SON package extends along a side of the land pad 522. The wettable flank is formed by sawing partially through the package and through the land pad 522 to create the channel 524 or additional edge around a perimeter of the package above the exposed periphery surface 521 of the land pad 522. This allows the solder fillets (not shown) to be more visible for quality checking after the package is mounted on a board through Automated Optical Inspection (AOI). AOI helps identify that a good electrical connection is formed with the land pad 522 and the solder by seeing when solder is exposed in the channel 524 or at the land pad 522. In the end, the QFN, DFN and SON packages include exposed copper on the outside, and particularly on the perimeter, surfaces of the packages through the cut land pads 510, 521 and through the cut leadframe 508. The exposed copper is prone to oxidation and is undesirable because it makes sidewall solder wetting difficult on the exposed surface 521.

Figure 1E:
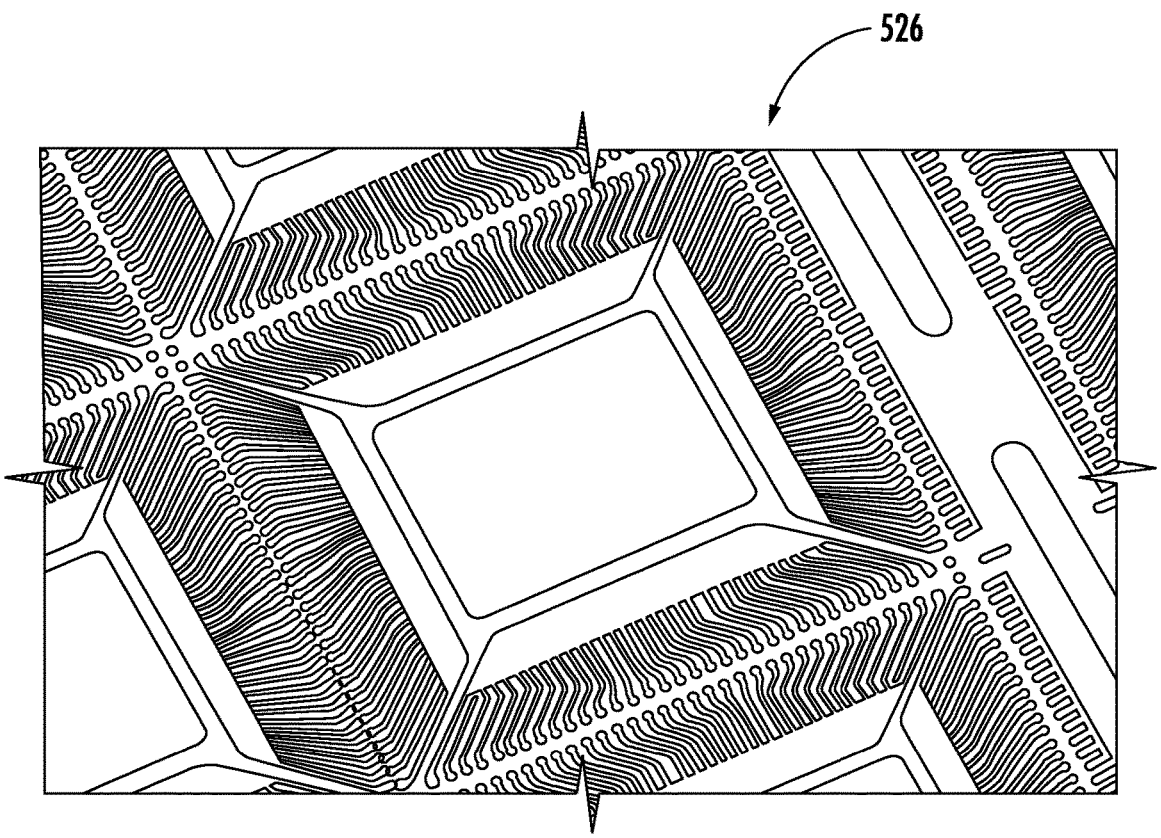
FIG. 1E is a view of a leadframe.

QFN, DFN and SON packages are a near chip-scale plastic encapsulated package made with a metal leadframe substrate. FIG. 1E illustrates a non-limiting example of a leadframe 526 to which ICs or semiconductor chips may be mounted. A leadframe 526 is the metal structure inside a leadframe-based chip package that creates leads which carry signals and power to and from the chip to the outside through metal conductors leading away from the chip. QFN, DFN and SON packages comprise perimeter land pads 502 and 522 (as seen in FIGS. 1A-1D) on the package edge 506 to provide electrical connections to the PCB, rather than using leads that extend beyond the body of the package. During packaging prior to singulation, the QFN, DFN and SON packages are in strip form, connected to adjacent packages on the leadframe. This also means that they are electrically interconnected through the conductive leadframe. The packages are later isolated or separated by cutting between the packages. In conventional QFN, DFN and SON packages, partial sawing to isolate each unit electrically is required before testing to allow electrical testing of the individual packaged semiconductor chips.

Figure 1F:
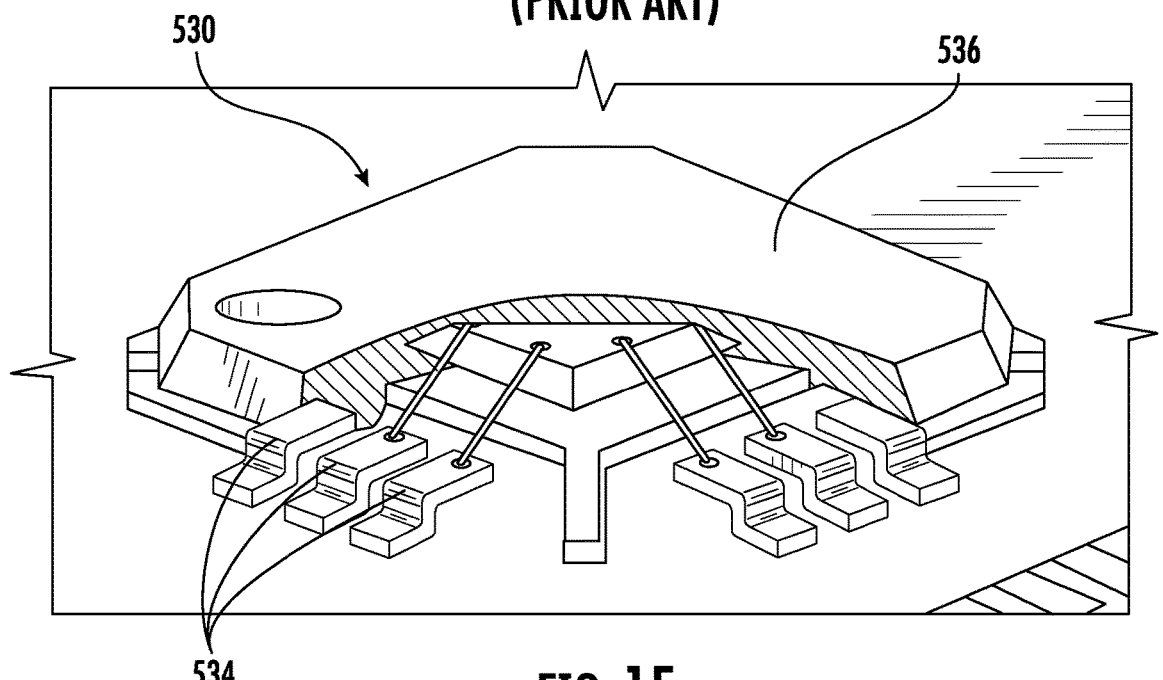
FIG. 1F is a perspective view of a semiconductor package using a leadframe.

In contrast, FIG. 1F illustrates a partial cut-away view of a chip package 530 with a chip wirebonded to metal leads 534 of a conventional leadframe package 530 where the leads 534 extend through the molded plastic encapsulant 536 and to an edge of the body of the plastic package to facilitate mounting or soldering the chip package 530 to a PCB. QFN, DFN and SON packages (as shown in FIGS. 1A-1D) may include land grid array (LGA) pads or other land pads within a footprint of the encapsulant rather than the leads that extend beyond the footprint or body of the encapsulant.

QFN, DFN and SON packages may also include an exposed thermally conductive pad, die pad or flag 512, as shown above in FIGS. 1A and 1C, to improve heat transfer out of the IC (into the PCB or substrate it is attached to). A flag 512 provides a heat dissipation point for the package for structures thermally coupled to it.

The present disclosure relates to QFN, DFN and SON packages without a leadframe, and with molded direct contact interconnect build-up structures. An example of a molded direct contact interconnect build-up structure is known under the trademark or tradename MDx™. Molded direct contact interconnect build-up structures (and a method for making and using the same) are discussed in U.S. Provisional Patent 63/347,516, the entirety of which is hereby incorporated herein by reference. Molded direct contact interconnect build-up structures may comprise or provide: (i) large area chip bond pad interconnect to create a very low contact resistance, (ii) removal of capture pads between build-up layers, such as traces, (iii) cost savings by removing polyimide and other polymers from the build-up layers, using mold compound instead, and (iv) facilitate ultra-high-density connections such as 20 micrometer bond pitch and smaller.

At least some of the above advantages are available at least in part by using unit specific patterning (such as adaptive patterning (custom design and lithography) and build-up interconnect structures such as a frontside build-up interconnect structure, which is also known under the trademark "Adaptive Patterning," referred to as "AP." Unit specific patterning: (i) allows for the use high-speed chip attach for semiconductor chips and AP will ensure alignment for high density interconnects with the molded direct contact interconnect build-up structures. Adaptive Patterning may also be used in the herein disclosed processes for manufacturing QFN, DFN and SON packages including the ability to make large area connections which are precisely aligned to chip bond pads for very low contact resistance.

Figure 2A:
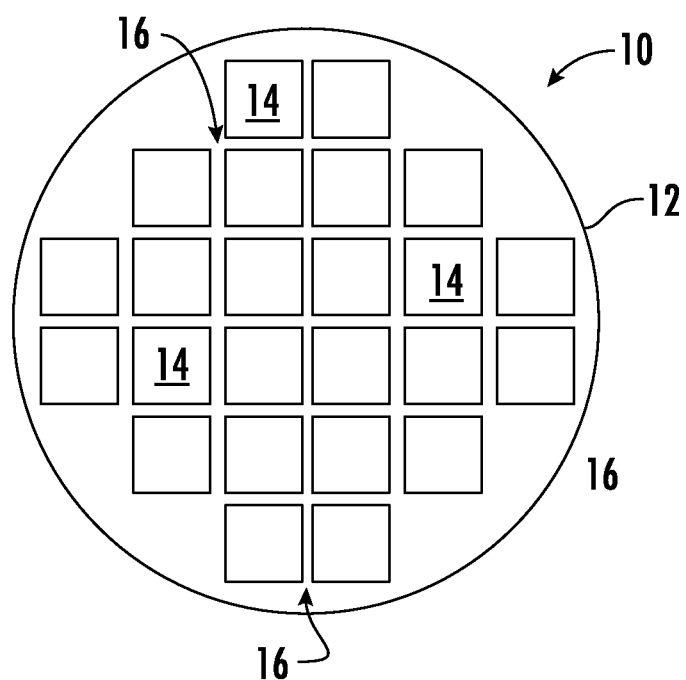
FIG. 2A is a planar view of a semiconductor wafer with a base substrate material having a plurality of semiconductor die or components.

FIG. 2A illustrates a plan view of a semiconductor wafer or native wafer 10 with a base substrate material 12, such as, without limitation, silicon, germanium, gallium arsenide, indium phosphide, silicon nitride, or silicon carbide, for structural support. A plurality of semiconductor chip 14 or components can be formed on wafer 10 separated by a non-active, inter-chip wafer area or saw street 16 as described above. The saw street 16 can provide cutting areas to singulate the semiconductor wafer 10 into the individual semiconductor chip 14. In other instances, integrated passive devices (IPDs), bridge chips, or other suitable devices that become embedded devices may also be formed on a substrate 8 formed of glass, ceramic, or other suitable material for providing structural support for subsequent processing.

Each semiconductor chip 14 may comprise a backside or back surface and an active layer opposite the backside. The active layer contains one or more circuits or discrete components of any kind implemented as active devices, or only conductive layers, and dielectric layers formed within or on the chip and electrically interconnected according to the electrical design and function of the semiconductor chip. For example, the circuit may include, without limitation, one or more transistors, diodes, and other circuit elements formed within active layer to implement analog circuits or digital circuits, such as DSP, ASIC, memory, or other signal processing circuits. The semiconductor chip may also contain IPDs such as inductors, capacitors, and resistors, for RF signal processing, digital power line control or other functions. The semiconductor chip 14 may consist only of conductive routing layers and associated dielectric layers such as for use as a bridge chip between active devices or other electrical function. The semiconductor chip 14 may also be added as one of many chips being added simultaneously on a carrier. The semiconductor chip may also be only a dummy substrate with no electrical function, but rather act merely as a structural element. In some instances there can be connections on both sides of the chip. The principles and structures taught in relation to this disclosure are applicable to known existing technologies that are compatible with the QFN, DFN or SON packages disclosed without a leadframe and using direct contact interconnect build-up.

Figure 2B:
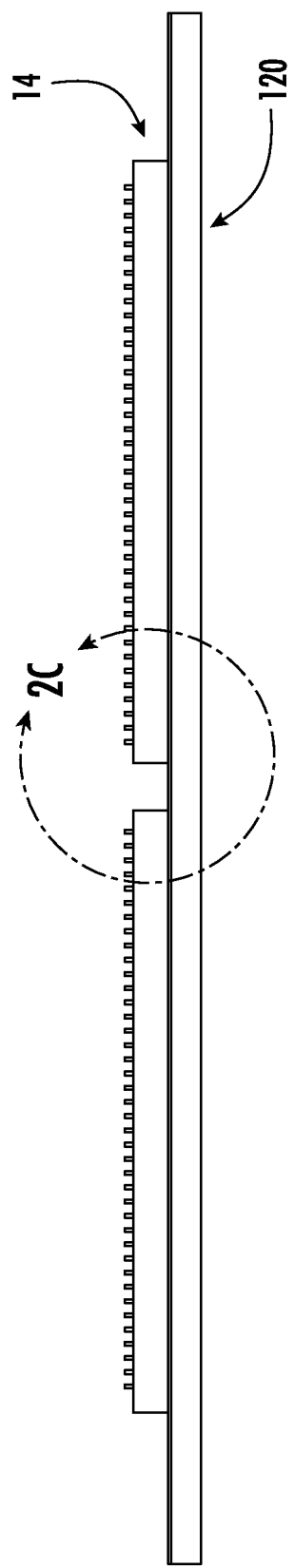
FIG. 2B illustrates disposing the semiconductor die face up over a temporary carrier.

FIG. 2B illustrates disposing semiconductor chips 14 face-up over a temporary carrier 120, the semiconductor chips each comprising conductive stumps over the active layer of the semiconductor chips. A conductive stump is a conductive interconnect structure that has generally vertical sides and is wider than it is tall, built-up on a substrate, such as over an active surface of a chip, polyimide or mold compound. A conductive stump, though typically formed of the same materials as a pillar or post would be formed, is different than a pillar or post which each has a height greater than its width. A conductive stump, though it commonly is formed in a cylindrical shape, may be formed in any polygonal or other shape and size. Another use for a conductive stump is as a dummy thermal conductive stump that is not electrically coupled to an active electrical circuit but is instead thermally coupled to a heat source of an active device to dissipate the heat to another structure, such as to a die pad on a surface of the package. (see FIGS. 7A-7D). The generally vertical sides of a conductive stump are different from the sides shape that exists for a solder ball or a squished out solder ball that has generally rounded sides, because the generally vertical nature of a conductive stump comes from imperfections in being formed in a structure that has been previously developed or etched, such as within openings in a photoresist layer. Developing or etching does not generally perfectly or uniformly remove the photoresist within the openings, and therefore forms imperfect, generally vertical openings for deposition of the conductive stump. Generally vertical includes perfectly vertical and imperfectly vertical sides. A conductive stump is not a wire bond or solder.

In some instances, the semiconductor chips will have a thickness (shown in the vertical direction, bottom to top, of the page) of between about 25 μm to about 150 μm for thin ground wafers, or about 100 μm to about 800 μm for thick ground wafers. In some instances, the temporary carrier may be a metal carrier, a silicon carrier, a glass carrier, or a carrier made of other suitable material used for the molding or encapsulating process, and then be removed after the encapsulant, such as mold compound, filled epoxy film such as ABF, or other dielectric such as polyimide has been placed, cured, or both, such that the encapsulant provides structural support and the temporary carrier is no longer needed for processing. The semiconductor chips 14 may be placed adjacent one another, such as in a side-by-side arrangement, so that multiple chips may be formed at a re-constituted wafer or panel level and processed through various fabrication steps, before being singulated into individual QFN, DFN or SON packages. As such, multiple chips may also be processed together at a same time over the temporary carrier, which will be understood by a person of ordinary skill in the art (POSITA), even when a close-up view of just portions of the semiconductor chips 14 are shown.

Figure 2C:
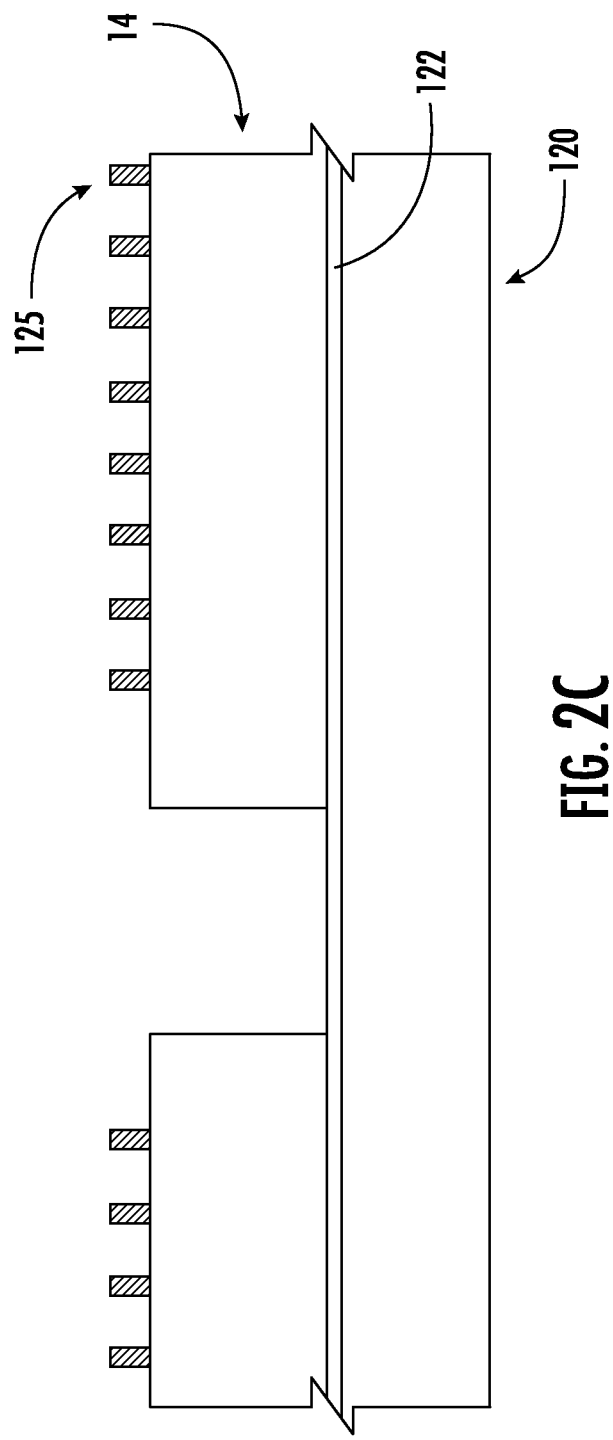
FIG. 2C is a close-up view of the center of FIG. 2B at section 2C.

FIG. 2C illustrates a close-up view of the semiconductor chips taken at section marker 2E of FIG. 2B, emphasizing the conductive stumps 125 (e.g. may be formed of copper) formed over the active layer, and aligned on the semiconductor chips 14. Although it is not required for every embodiment, the conductive stumps 125 of the particular embodiments illustrated herein are shown about a perimeter of the semiconductor chips 14 for the particular implementation in which they will be used. An optional interface layer 122, such as double-sided tape, film or deposited material, may be used beneath the semiconductor chips 14 to temporarily hold them to the temporary carrier 120 during processing.

Figure 2D:
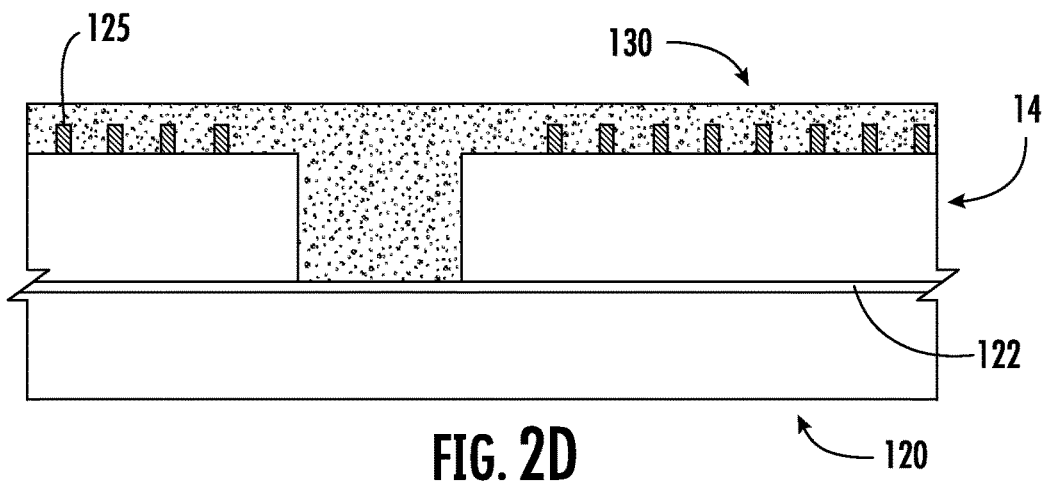
FIG. 2D illustrates disposing an encapsulant around the semiconductor die.
Figure 2E:
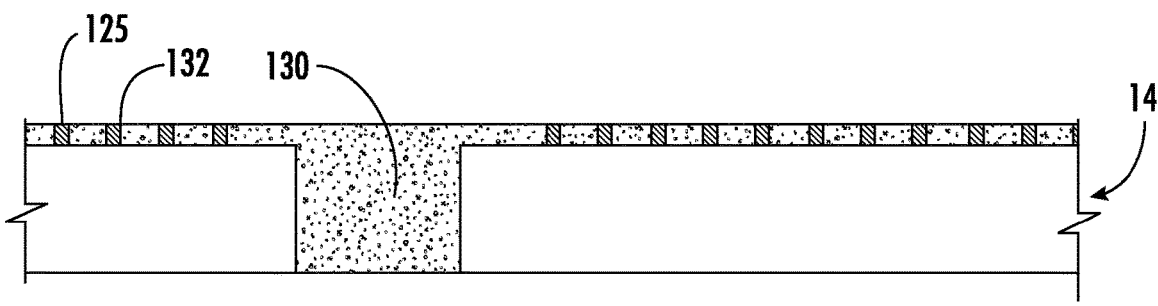
FIG. 2E illustrates planarizing the encapsulant over an active layer of the semiconductor.

FIG. 2D, continuing from FIGS. 2B and 2C, illustrates disposing an encapsulant 130 around the semiconductor chips 14 face-up over a temporary carrier 120 around four side surfaces of the semiconductor chip 14, over the active layer of the semiconductor chips 14, and around the conductive stumps 125. As used herein, over, on or around may mean in direct contact with, or with other intervening layers, such as polymer or polyimide layers disposed between the chips 14 and the encapsulant 130. The conductive stumps 125 formed over the active layer of the semiconductor chips 14 may be in contact with, surrounded by, partially encircled by, or encapsulated or molded with a single encapsulant, polyimide or mold compound at a single step such that the same encapsulant, polyimide or mold compound 130 is disposed around the semiconductor chips 14. The encapsulant 130 can be deposited around the plurality of semiconductor chips 14 using a paste printing, compression molding, transfer molding, liquid encapsulation, dispensing, lamination, vacuum lamination, spin coating, slit or slot die coating, or other suitable application. The encapsulant 130 comprises an organic material, a mold compound, a polyimide, a composite material, such as epoxy resin with filler, such as ABF or epoxy acrylate with filler, and is a material suitable for planarizing, such as through chemical mechanical planarizing (CMP) or grinding. As such, in some instances the encapsulant 130 will not be a polymer material, such as an un-filled polyimide, that does not perform well in a grinding operation, and may gum-up a grinding wheel. FIG. 2E illustrates the exposed planar surface 132 with the interconnect structures 125 exposed.

Figure 2F:
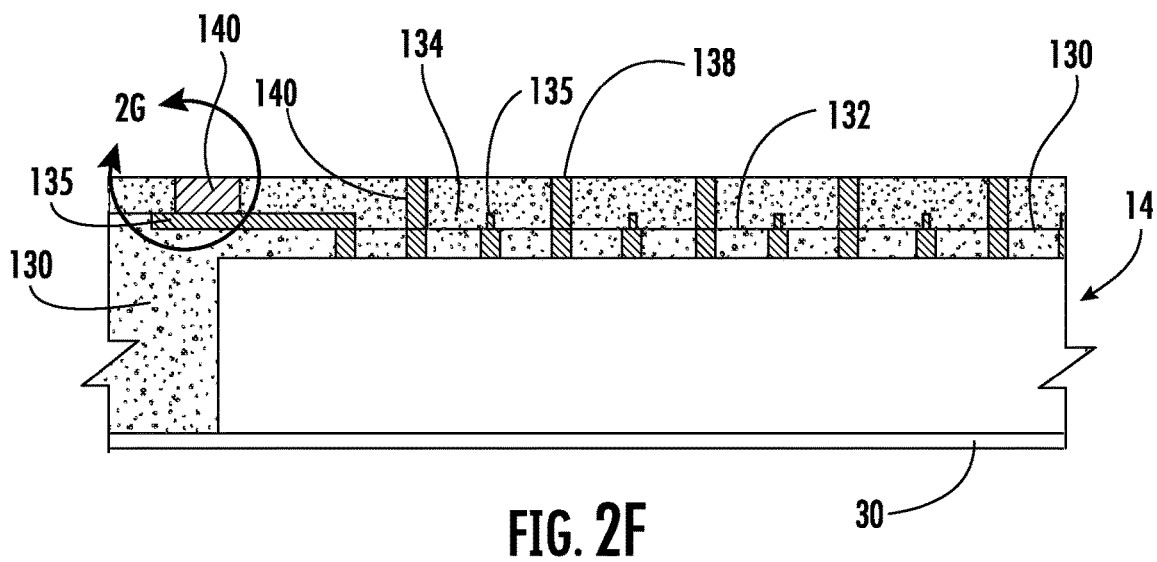
FIG. 2F illustrates disposing a photoresist layer over the encapsulant and depositing a conductive layer with first vertical conductive contacts.

FIG. 2E also illustrates that after molding, the temporary carrier 120 may be removed, and a backside or back surface of the semiconductor chips 14 may be exposed from the encapsulant 130. Alternatively, a backside laminate, encapsulant, die attach film (DAF) or other material 30 may be disposed over the backside of the semiconductor chips 14 as shown in FIG. 2F. Thus, in some instances the backside laminate (including polyimide or mold compound) may be more than temporary and may become part of the final product, or may be removed at a later process step, such as at a grinding or polishing step. In reference to FIGS. 6A-6F, included further below, different processing steps may be included to result in the backside of the semiconductor chip being exposed with respect to, or covered by, encapsulant or other material.

Planarizing or grinding the encapsulant 130 over the active surface to expose the conductive stumps 125 may occur before or after removing the temporary carrier 120. As referenced above, FIG. 2E illustrates a close-up view of a portion of a semiconductor chip after planarizing the encapsulant over an active layer of the semiconductor chips to create a planar surface comprising exposed ends of the conductive stumps and planarized encapsulant surface. The planarizing or grinding of the encapsulant produces a flatness of within a range of about 0.5-5 micrometers and a total roughness height from peak to valley measured over a 1 milllimeter (mm) length of between 5 and 500 nanometers (nm). While conventional encapsulant grinding might be done with less flatness, greater accuracy and precision can be obtained by using integrated sensors such as laser, acoustic, or other non-contact methods to control the grinding resulting in better flatness. In some instances, the first conductive stumps may be formed with a height of less than or equal to about 50 micrometers (μm) or less than or equal to about 250 μm, and then be ground down to a height of less than its original height, such as, in a particular embodiment, less than or equal to about 4 μm or 1 μm. As used herein, "about" or "substantially" means a percent difference less than or equal to 50% difference, 40% difference, 30% difference, 20% difference, 10% difference, or 5% difference.

FIG. 2F, continuing from FIG. 2E, is a cross-sectional side view showing a second encapsulant layer 134 over the encapsulant 130, such as on the planar surface 132, and further comprising the conductive layer 135 with its first vertical conductive contacts 140 formed within the photoresist layer openings 138. The conductive layer 135 may also include a redistribution layer (RDL) with RDL traces 135 added through known methods similar to adding the first vertical conductive contacts 140 through openings in a layer of photoresist. In other embodiments, additional RDL traces may be included in any number of additional conductive layers formed over or below the conductive layer 135 using the same or modified methods of applying an RDL as described herein. The respective first conductive layer 135 and first vertical conductive contacts 140 may be configured to be electrically coupled with the conductive stumps of the semiconductor chips 14. Additionally, the first vertical conductive contacts 140 may be formed as conductive stumps 140. Additional conductive stumps may be formed elsewhere in the structure within intermediate layers of encapsulant. The conductive stumps may be planarized or grinded with the encapsulant layer to create a planar surface layer that includes encapsulant and exposed conductive stumps. The respective first conductive layers 135 and first vertical conductive contacts 140 for each chip 14 may be formed using one or more of PVD, CVD, electrolytic plating, electroless plating process, or other suitable metal deposition process. The first conductive layers 135 and first vertical conductive contacts 140 may comprise one or more layers of copper (Cu), titanium (Ti) aluminum (Al), tin (Sn), nickel (Ni), gold (Au), silver (Ag), platinum (Pt), tungsten (W), tantalum (Ta), cobalt (Co) or other suitable electrically conductive material including alloys. As each conductive layer and structure is formed, additional encapsulant 130 may also be added to surround the structures as illustrated in FIG. 2G.

Figure 2G:
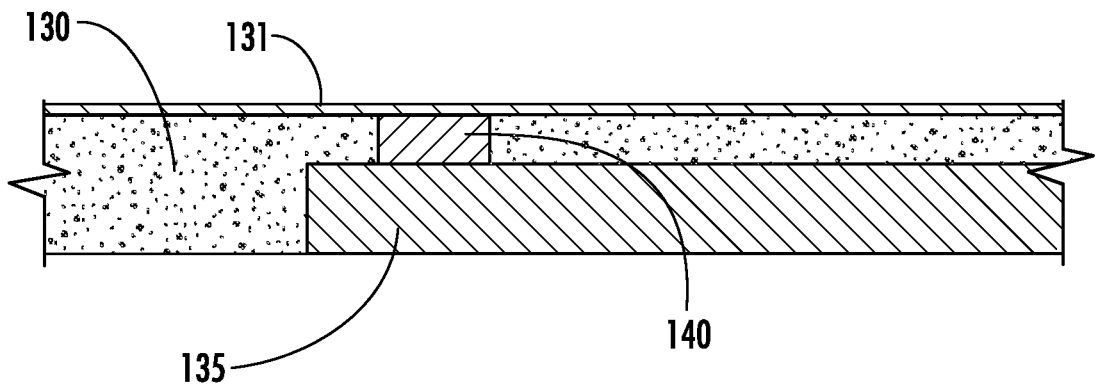
FIG. 2G is a close-up view of the package build-up process of FIG. 2F with encapsulant around the first vertical conductive contacts.

FIG. 2G illustrates a close-up view of FIG. 2F taken at section marker 2G, taken after addition of mold compound 130 around the RDL 135 and conductive stumps 140, and further planarizing or grinding as described previously. FIG. 2G is illustrative of the process occurring over the entire chip packaging process and is not limited to the representative section illustrated in the following figures. In FIG. 2G, a seed layer 131 of a conductive metal such as, copper (Cu), titanium (Ti) aluminum (Al), tin (Sn), nickel (Ni), gold (Au), silver (Ag), platinum (Pt), tungsten (W), tantalum (Ta), cobalt (Co) or other electrically conductive material including alloys is applied over the entire surface of the package being formed. Before electro plating, a seed layer 131 may be deposited through, for example, sputter PVD prior to the photoresist layer (see FIG. 2H and related description). The seed layer 131 acts as a plating bus to allow electroplating of the conductive stumps 140, RDL 135 or pads 142.

FIG. 2G emphasizes the structure formed over the RDL trace 135 that extends out beyond the edge of the semiconductor chip 14. FIG. 2G illustrates that, prior to deposition of the seed layer 131, additional conductive material may be formed as additional conductive features, including traces, conductive paths, interconnects or studs, conductive pads, formed as land or LGA pads or bumps, passive components (e.g., a spiral inductor), or other desired features. Some non-limiting examples of additional features are included and described with further detail in FIGS. 6A-6F. While QFNs, DFNs or SONs often have one layer of trace routing, depending on a complexity of routing patterns or other preference or need, multiple layers of traces, alternating with an insulating material such as encapsulant or other desired material, may also be used.

Figure 2H:
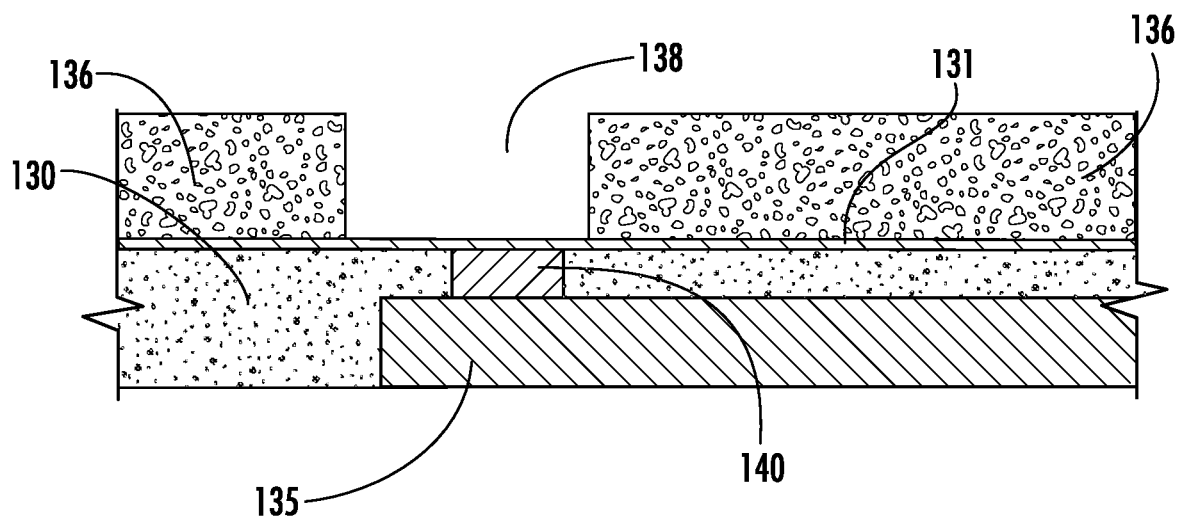
FIG. 2H is a close-up view like FIG. 2G, illustrating depositing a first photoresist layer over the encapsulant.
Figure 2I:
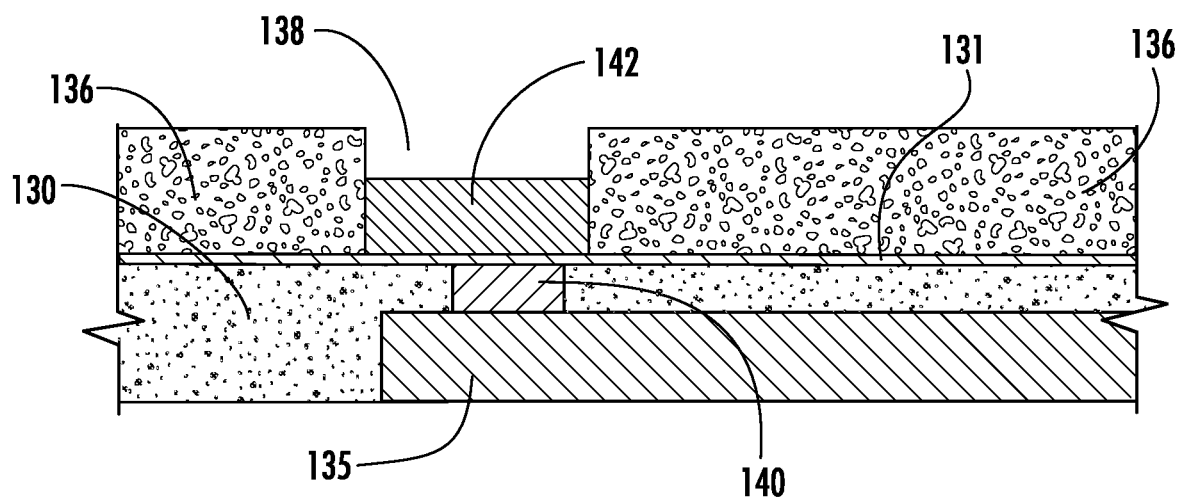
FIG. 2I is a close-up view like FIG. 2G, illustrating depositing a conductive pad within the first photoresist layer opening.

FIG. 2H, continuing from FIG. 2G, is a cross-sectional side view of forming a first photoresist layer 136 over the encapsulant 130 and the seed layer 131, such as over the planar surface, with a first photoresist layer opening 138 above the first vertical conductive contact 140. Conductive studs (such as 2 or any desired number of conductive studs) may be used instead of vias that are etched and filled. Alternatively, conductive stumps 140 may be used. In particular embodiments, the conductive stumps may be used as a conductive pad (see conductive stumps 179 in FIG. 6E), extending straight up rather than overlapping the encapsulant as shown in FIG. 2I. Additionally, a solderable metal system (SMS) may be applied to the exposed surface(s) of the conductive stump similar to that done to a conductive pad 142 (see FIG. 2L and related explanation).

FIG. 2I, continuing from FIG. 2H, is a cross-sectional side view similar to FIG. 2H, illustrating a conductive pad 142, such as a LGA pad or bump, being formed within the first photoresist layer opening 138. In a particular embodiment, the conductive pad may comprise 9 μm to 50 μm thick Cu (conductive stumps, RDL or pads) or other electrically conductive material.

Figure 2J:
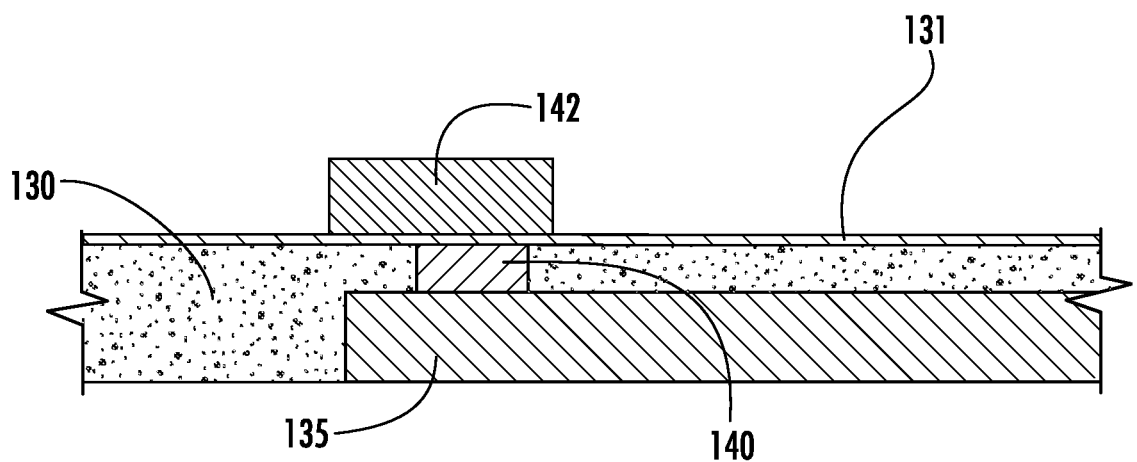
FIG. 2J is a close-up view like FIG. 2G, illustrating removing the first photoresist layer.

FIG. 2J, continuing from FIG. 2I, is a cross-sectional side view similar to FIG. 2I, illustrating removing the first photoresist layer 136 after forming the conductive pads 142. Because an electroplating step occurs again in relation to the method described in FIG. 2K, the seed layer 131 is not removed when the first photoresist layer 136 is removed.

Figure 2K:
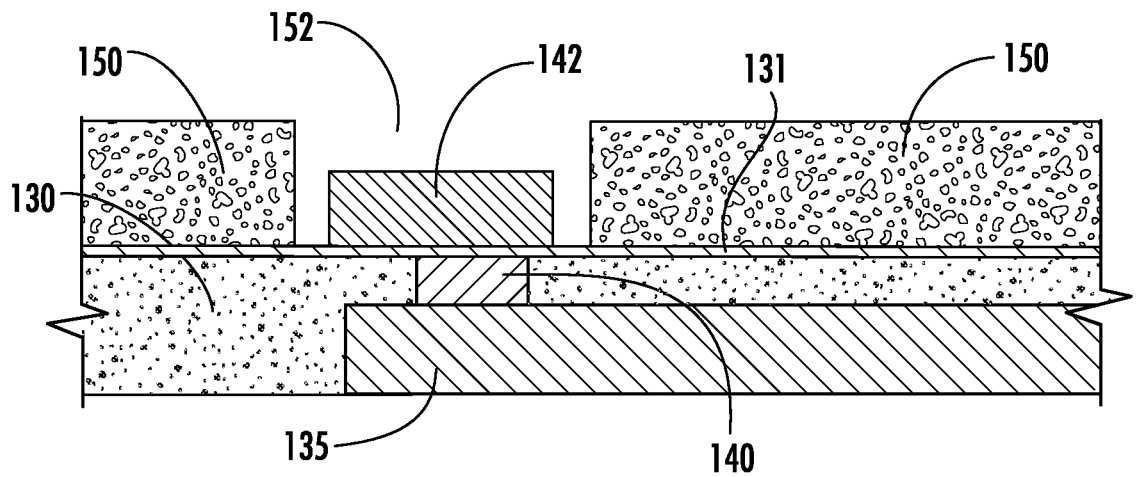
FIG. 2K is a close-up view like FIG. 2G, illustrating forming the second photoresist layer over the encapsulant.

FIG. 2K, continuing from FIG. 2J, is a cross-sectional side view similar to FIG. 2J, illustrating forming a second photoresist layer 150 over the encapsulant 130 and seed layer 131, such as over the planar surface, with a second photoresist layer opening 152 above the conductive pad 142 or stud. In particular embodiments, such as that illustrated in FIG. 2K, the second photoresist layer openings 150 may be larger than the conductive pad 142 top surface, such as 2-10 μm larger on each side (or along a perimeter) of the conductive pad 142. Stated another way, the openings in the second photoresist layer 150 may comprise an offset between the conductive pad 142 and an edge of the second photoresist layer 150 comprising a distance of 2-10 μm or 5-50 μm.

Figure 2L:
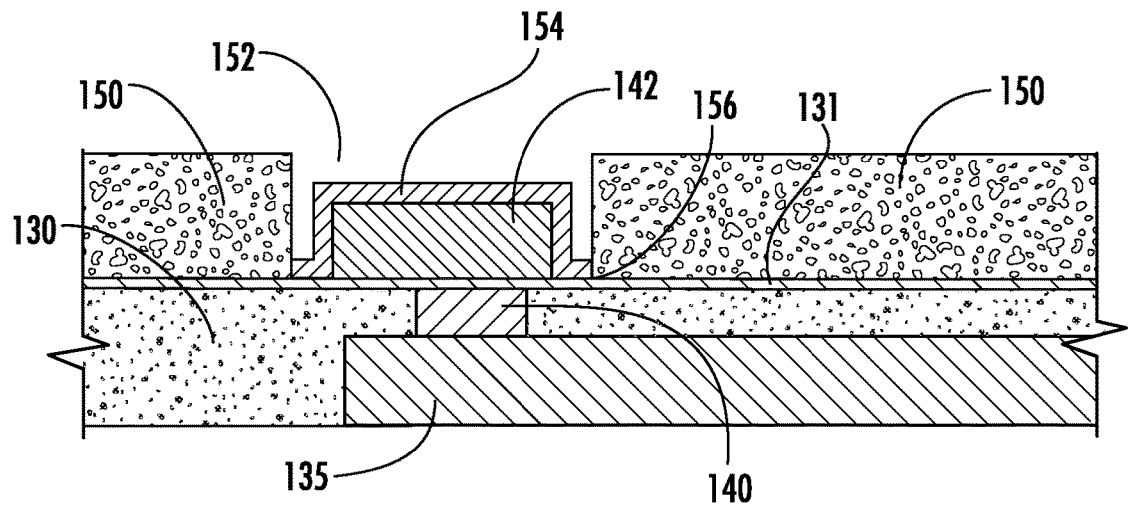
FIG. 2L is a close-up view like FIG. 2G, illustrating a solderable metal system (SMS) over at least a portion of the conductive pad.

FIG. 2L, continuing from FIG. 2K, is a cross-sectional side view similar to FIG. 2K, illustrating forming (such as by electrolytic, electroless or immersion plating or other suitable process) a solderable metal system (SMS) 154 over at least a portion of the conductive pad 142. In some embodiments, organic solderability preservative (OSP) may be used instead of or in addition to an SMS to enhance solderability of the conductive pads 142 and to resist oxidation over at least a portion of the conductive pads 142. The SMS 154 may comprise a nickel layer 1-2 µm thick, followed by a layer of palladium (Pd) 0.1-0.05 µm thick. Any suitable material may comprise the SMS 154, including one or more layers of Ni, Pd, gold (Au), tin (Sn), solder, silver (Ag), OSP, or other suitable material, forming the SMS as a single or multi-material build-up. The SMS 154 may be formed over a top surface and 4 (or any number) of adjoining side surfaces of the conductive pad 142. As used herein, the "sides" of the conductive pads 142 may be any adjoining or adjacent surface, including vertical, sloped, chamfered, or other surfaces. The conductive pads 142 and SMS 154 may also be offset from, or formed over, the encapsulant 130 or mold compound. As shown in FIG. 2L, by forming the SMS 154 within a second photoresist layer opening that is larger than the top surface of the conductive pad 142, a foot 156 is formed around a base of the conductive pad 142.

For the embodiments illustrated in FIGS. 2A-2M and 3A-3D, because the SMS 154 covers the exposed surfaces of the conductive pads 142 and the QFN, DFN and SON packages do not include a leadframe with a cut frame part exposed through the packaging, and the conductive pads 142 are not cut at a side of the package to expose the conductive pad 142, the completed package does not have exposed copper. In particular, the QFN, DFN and SON packages formed according to this method are formed without exposed copper on the periphery of the package. Additionally, by not cutting the conductive pads 142, the problem of burrs being formed on the conductive pads 142 is eliminated and the additional processing to remove the burrs is not necessary.

Unlike with a conventional QFN, DFN and SON packages that cannot be tested until the leadframe is cut to isolate the packages from other adjacent packages. Embodiments of the present design with the conductive pads 142 inset from an edge of the package may be tested in strip form without the need to isolate the packaged semiconductor chips prior to testing.

Figure 2M:
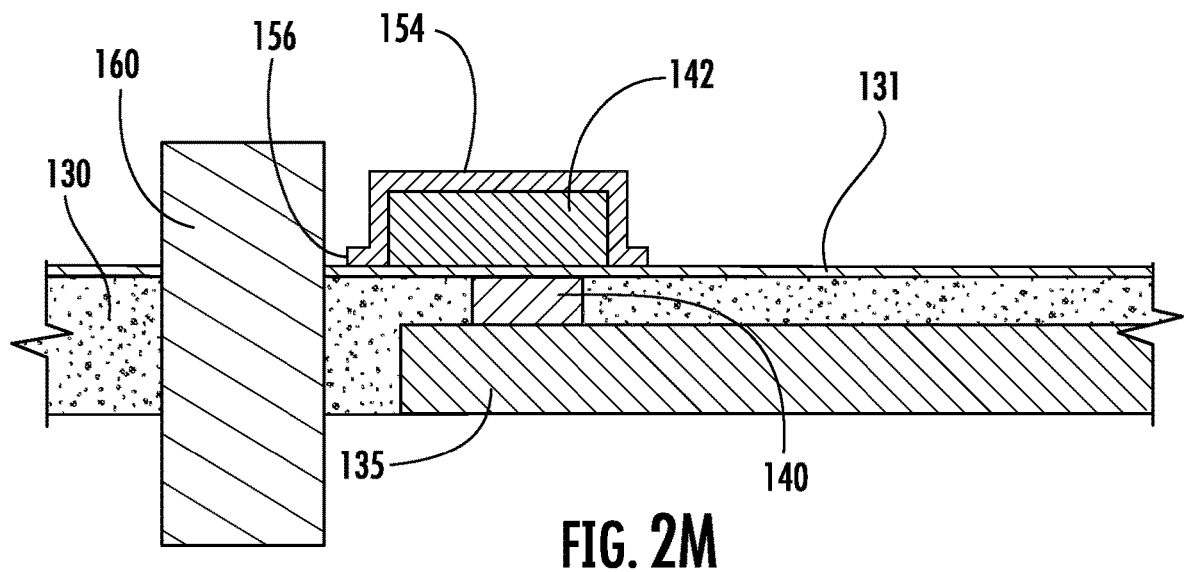
FIG. 2M is a close-up view like FIG. 2G, illustrating removal of the second photoresist layer and singulating the packages.

FIG. 2M, continuing from FIG. 2L, is a cross-sectional side view of the conductive pad 142 with the SMS 154 after the removal of the photoresist layer and the portions of the seed layer 131 in FIG. 2L that are not covered by conductive material. In this Figure, the individual QFN, DFN or SON packages are being singulated from each other by a sawing process using saw 160, or other suitable process including laser or scoring. As shown in FIG. 2M, the singulation edge may be offset from both the conductive pad 142 and SMS 154 for a better cut, as further discussed below.

Figure 3A:
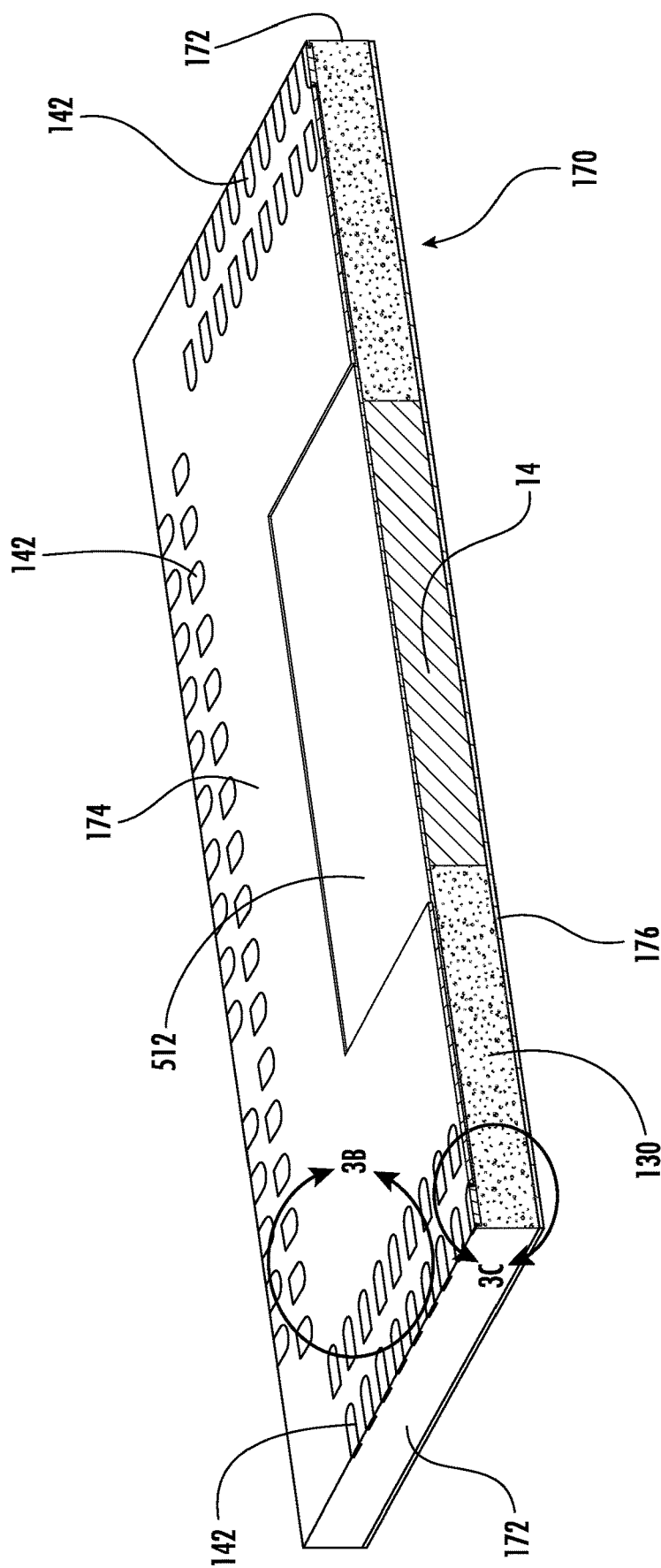
FIG. 3A is a perspective view of a singulated package.
Figure 3B:
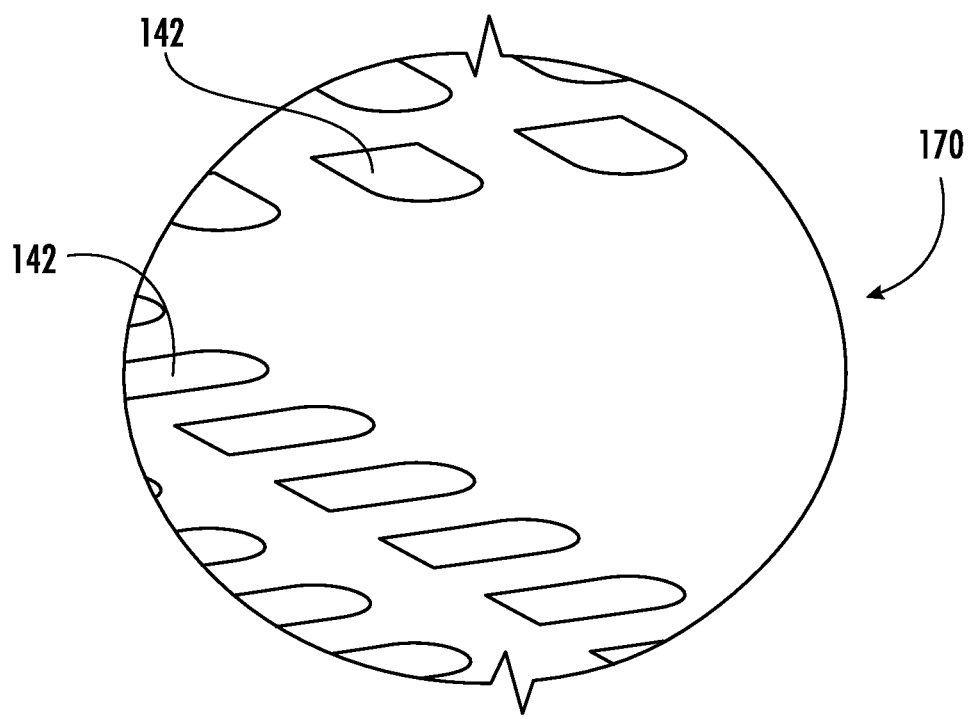
FIG. 3B is a perspective view of a first section 3B of the singulated package of FIG. 3A.
Figure 3C:
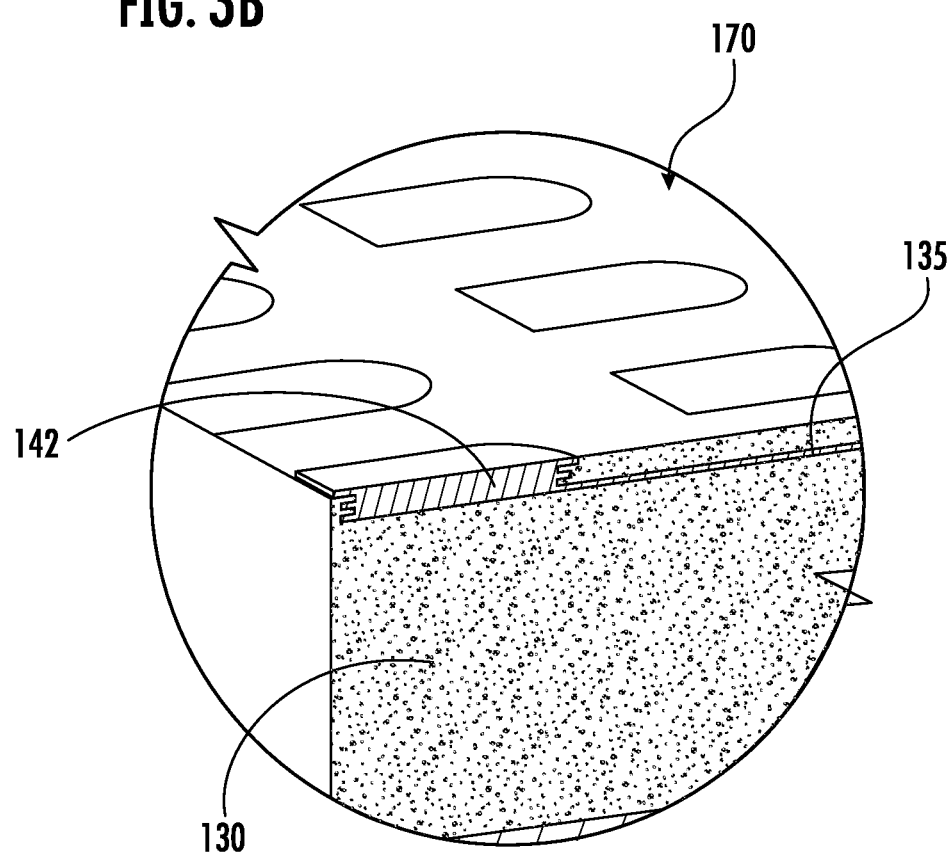
FIG. 3C is a perspective view of a second section 3C of the singulated package of FIG. 3A.

FIG. 3A is a cross-sectional view of a QFN package 170 illustrating conductive pads 142, with or without SMS 154, exposed on the surface of the package 170. The final package 170 includes semiconductor devices and non-semiconductor components with conventional packaging materials included around the structures discussed previously herein. FIG. 3B is a close-up view of the section 3B in FIG. 3A. FIG. 3C is a close-up view of the cross-sectional section 3C in FIG. 3A, emphasizing the RDL traces and the conductive pads 142. Note that in this embodiment, because the conductive pads 142 were formed with an inset from the singulation cut line, no part of the conductive pads 142 is exposed on the side surfaces 172 of the package other than the top 174 and bottom 176 surfaces, in some embodiments, of the final package 170.

Figure 4A:
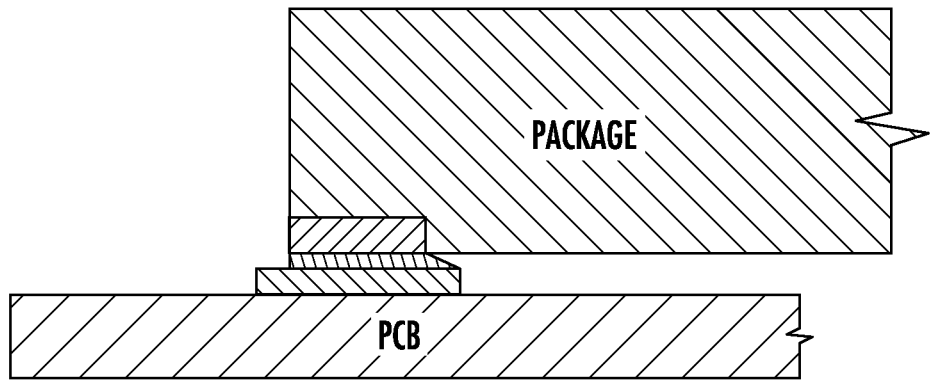
FIG. 4A illustrates an example where the solder joint cannot be inspected.
Figure 4B:
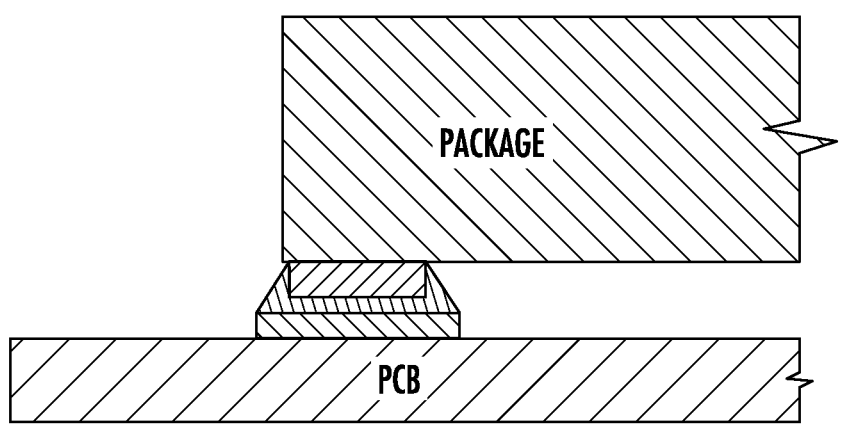
FIG. 4B illustrates an example where the solder joint can be inspected.

FIGS. 4A-4B illustrate two examples of AOI attempts for a solder joint for a semiconductor package when bonding to a printed circuit board. FIG. 4A illustrates an attempt to inspect the solder joint with a traditional QFN package with the conductive pad embedded in the encapsulant, with the conductive pad at the edge of the encapsulant after being sawn through during singulation. The sawn vertical edge includes bare copper (Cu) and will not wet with solder. Therefore, AOI is unable to visually inspect the edge of the solder ball to determine if it is of sufficient quality. As a result, inspection is less reliable and more expensive to perform. FIG. 4B illustrates an attempt to inspect the solder joint when the conductive pad is configured according to disclosed embodiments of the present disclosure. Because the conductive pad is adjacent the side of the package (a 1 µm or more offset between the package edge and an edge or side of the conductive pad), and includes a wettable vertical surface, the solder may be formed at the edge of the package and the solder extends beyond an edge of the package and is visible using AOI.

Figure 5C:
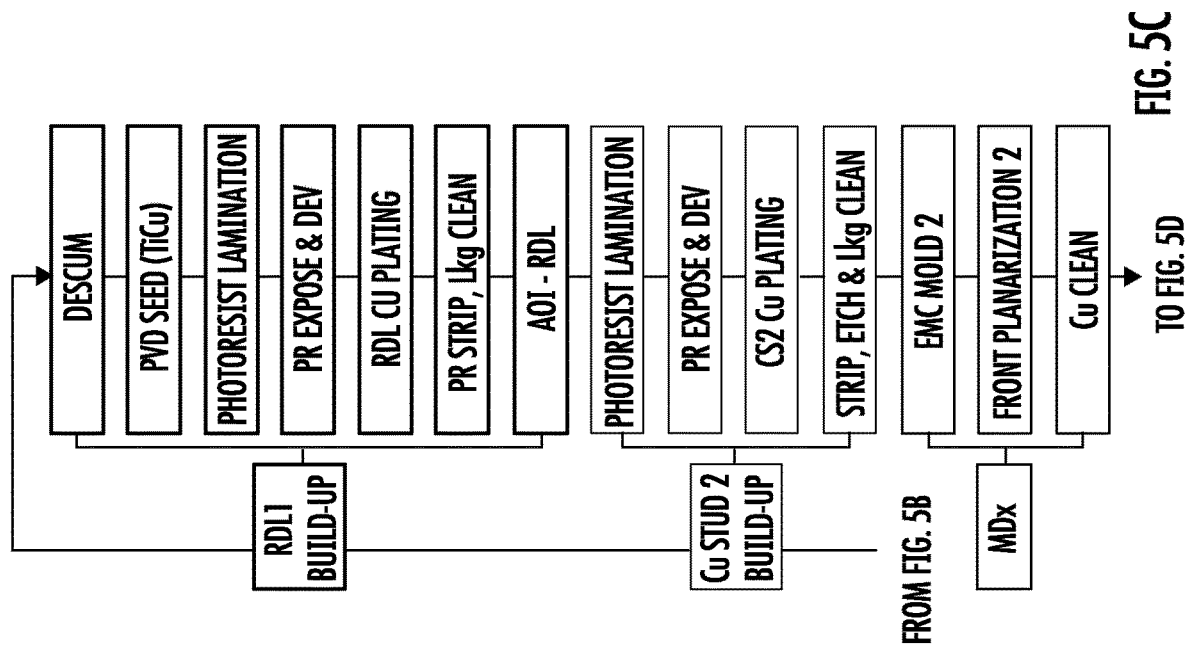
Figure 5B:
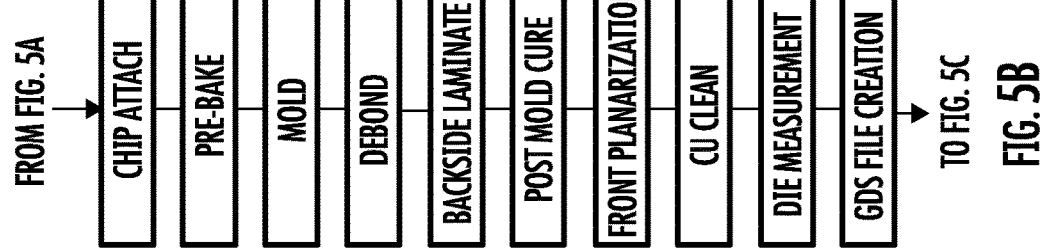
Figure 5A:
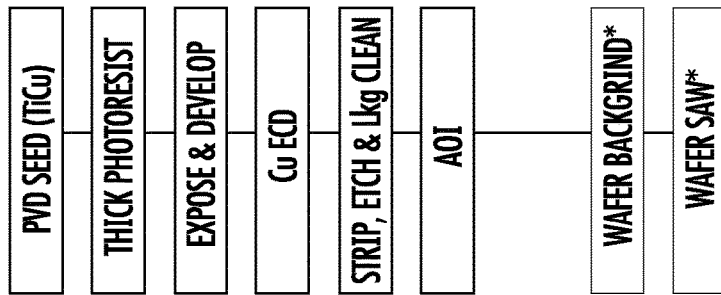

FIGS. 5A-5E, illustrate a process overview, flow, or method for forming a QFN, DFN or SON without a leadframe. FIG. 5A illustrates the input wafers and CU stud phase, aspects of which are referenced in relation to FIGS. 2A-2C herein. FIG. 5B illustrates a panelization phase, aspects of which are referenced in relation to FIGS. 2D-2E herein. FIG. 5C illustrates a RDL build-up phase, aspects of which are referenced in relation to FIGS. 2F-2I herein. FIG. 5D illustrates a conductive pad build-up phase, aspects of which are referenced in relation to FIGS. 2J-2O herein. FIG. 5E illustrates a test and finish phase, aspects of which are referenced in relation to FIGS. 2P-3C.

FIGS. 6A-6F, illustrate various views of QFNs without leadframes similar to those described above formed according to the processes discussed herein. Each Figure illustrates how the technology and processes described and illustrated in relation to this disclosure can be combined with other various technologies for use in semiconductor packaging. Those of ordinary skill in the art will understand how to combine the disclosures below with the processes described above based on the disclosures provided herein.

Figure 6A:
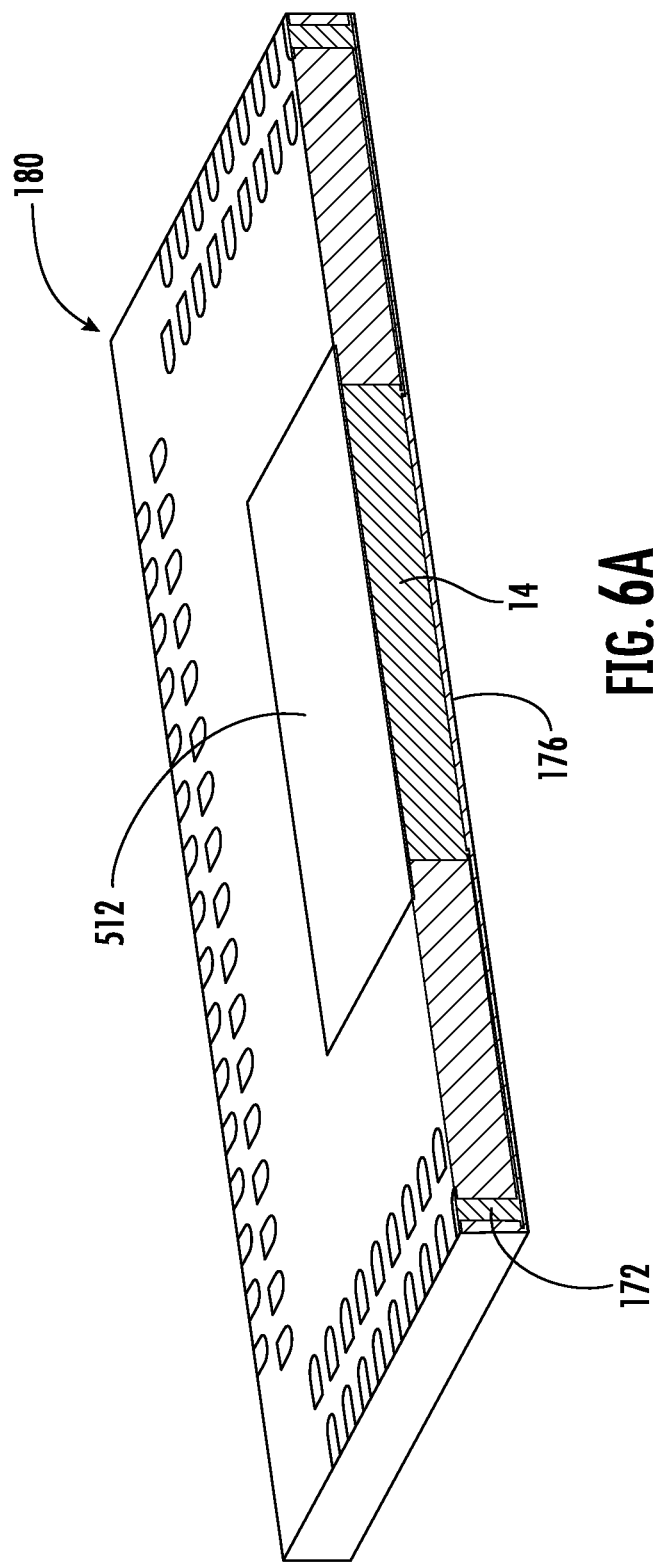
FIG. 6A is a perspective cross-sectional view of a QFN package with through mold posts (TMP).

Although the illustrations show QFN packages, the technologies and processes disclosed herein can also be used with DFN and SON packages. FIG. 6A illustrates a perspective view of an embodiment of a QFN package 180 with a cross-section through a center of the package. The QFN package 180 includes including at least one through mold post (TMP) 172 extending from a conductive pad on a first surface of the package to an opposing side of the package 170, providing vertical interconnect through the package, passive devices, or both. In some instances, the land routing/layout of the present package may be a mirror image of a traditional QFN, DFN or SON that uses wirebonding. If desired, additional routing could be used to mitigate the difference.

FIG. 6B illustrates a perspective view of an embodiment of a QFN package 182 with a cross-section through a center of the package. The QFN package 182 includes passives or other devices mounted or coupled to a top of the package 182, and pads for additional devices or packages to be mounted thereto. The pads may, in particular embodiments, be formed as conductive stumps extending from and electrically connected to the semiconductor chip directly or through an RDL (see FIG. 6E).

FIG. 6C illustrates a perspective view of an embodiment of a QFN package 182 of FIG. 6B with a cross-section through a center of the package. FIG. 6C, however, includes a semiconductor device 190 mounted to the pads on the top of the package 182.

FIG. 6D illustrates QFN, DFN or SON packages 184 stacked on top of each other and mounted to a printed circuit board (PCB). TMPs 172 are formed within the chip packages 184 to conduct signals between the chip packages 184 and the PCB.

Figure 6E:
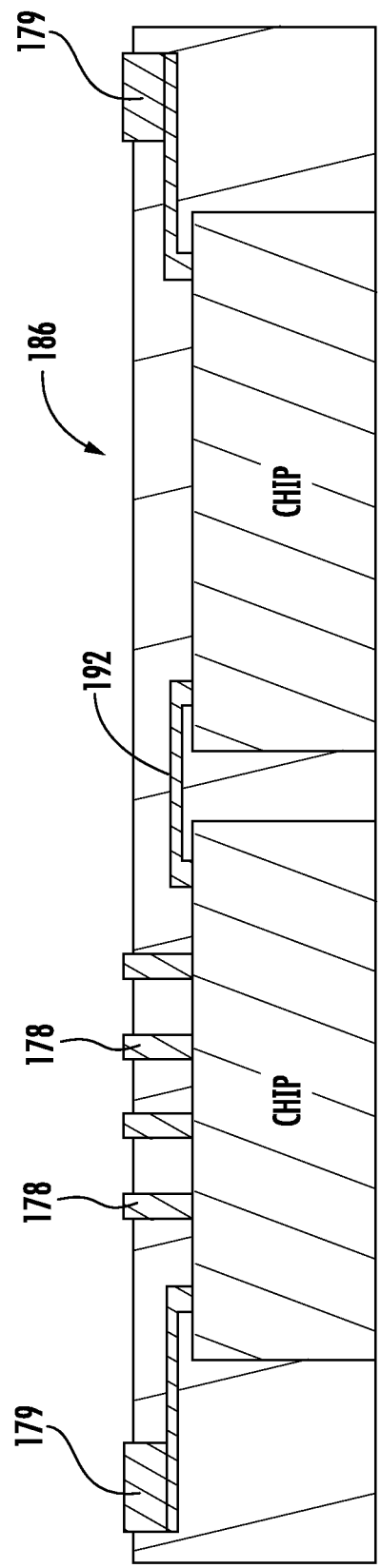
FIG. 6E illustrates a multi-chip QFN, DFN or SON package including multiple chips in the same package positioned side-by-side.

FIG. 6E illustrates a multi-chip QFN, DFN or SON package 186 including multiple semiconductor chips within the same package 186. One or more conductive traces 192 can be formed while forming the build-up traces for the package to conduct signals between the semiconductor chips. Additionally, dummy thermal conductive stumps 178 over the active surface of the semiconductor chip 14. The dummy thermal conductive stumps 178 are built-up structures formed like other conductive stumps discussed herein, and are thermally coupled between the semiconductor chip 14 and the thermally dissipative die pad 512 on the QFN, DFN or SON package. Conductive stumps 178 formed over the active surface may also be electrically connected to a circuit of the semiconductor chip 14 and conduct signals between the semiconductor chip 14 and the die pad 512. When attached to the active surface, the conductive stumps 178 would not be called dummy conductive stumps.

In other embodiments, the dummy thermal conductive stumps 178 dissipate heat to the die pad 512 but are not electrically connected. In embodiments where the conductive stumps 178 are electrically connected the semiconductor chip 14, the die pad 512 may be configured as a die attach feature with an additional semiconductor chip attached over the die pad 512, electrically connected to the semiconductor chip 14 through the die pad 512 and wire bonded to the contact pads 142 of the QFN, DFN or SON package 170. In cases where there is wiring on the top chip layer that prevents use of a dummy pad, conductive stumps 178 may attach on top of the chip passivation layer or other dielectric that is on top of the chip. In particular embodiments, a ground connection may be made from one or more ground pads on the semiconductor chip 14 through one or more conductive stumps 178 to the die pad 512. In such cases, the die pad 512 may be soldered to a corresponding ground pad on the PCB when the QFN, DFN or SON package is mounted on the PCB.

Figure 6F:
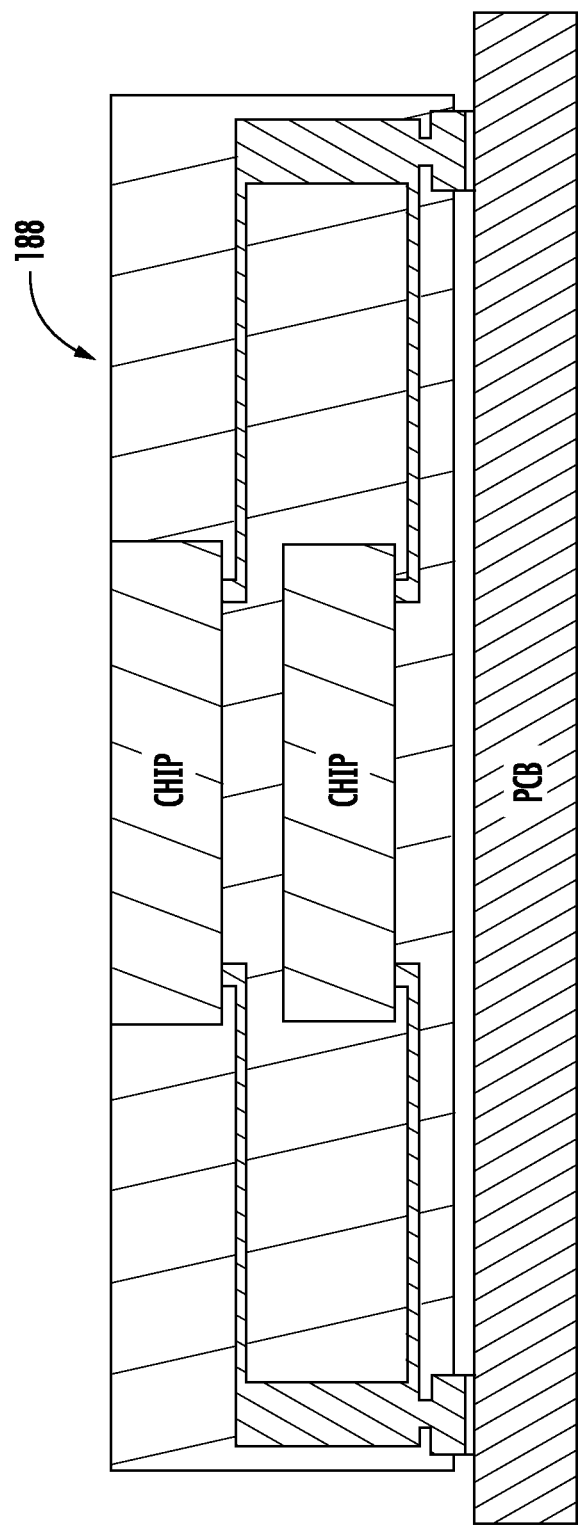
FIG. 6F illustrates a multi-chip QFN, DFN or SON package including multiple chips in the same package positioned on top of each other.

FIG. 6F also illustrates a multi-chip QFN, DFN or SON package 188 including multiple semiconductor chips within the same package 188. In FIG. 6F, however, the chips are stacked on top of each other rather than side-by-side. The conductive traces within the package 188 may be used to communicate signals between the chips and the PCB.

FIG. 7A illustrates a cross-sectional view of a QFN, DFN or SON package formed with a plurality of dummy thermally conductive stumps 178, 179 formed over the active surface of the semiconductor chip 14. A first layer of thermally conductive stumps 179 is coupled to the active surface of the semiconductor chip 14 and to an RDL 135. A second layer of thermally conductive stumps 178 is thermally connected between the RDL 135 and the die pad 512 to thermally dissipate heat from the semiconductor chip 14 through thermal conduction to the PCB through the conductive stumps, 178, 179, the RDL 135 and the die pad 512. The die pad 512 is soldered to a pad on the PCB.

Figure 7B:
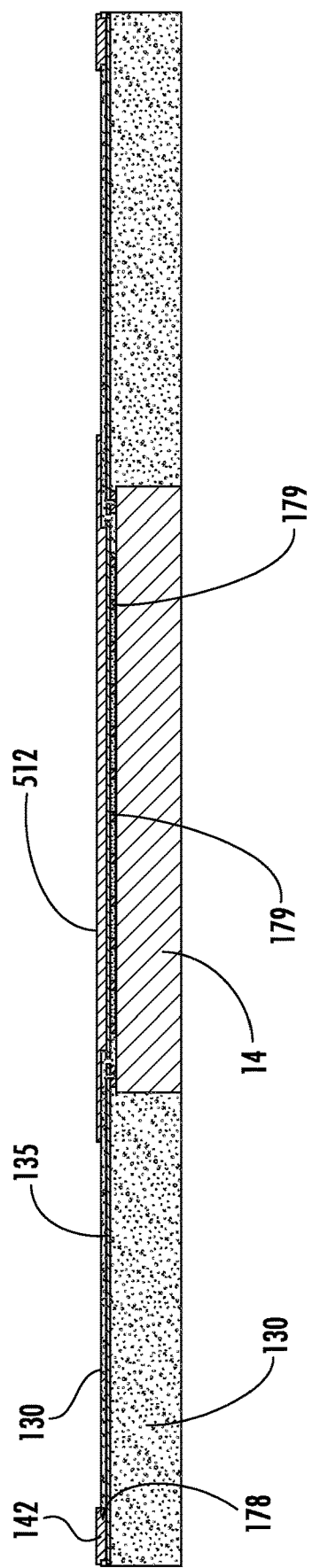
FIG. 7B illustrates a cross-sectional view of a QFN, DFN or SON package like that of FIG. 7A, with a thicker die pad.

The QFN, DFN or SON package structure of FIG. 7B is formed like the QFN, DFN or SON package of FIG. 7A, but without a secondary layer of conductive stumps between an RDL and the die pad 512. The die pad 512 is formed thicker to more efficiently transfer heat laterally, and the conductive stumps 179 extend directly to the die pad.

Figure 7C:
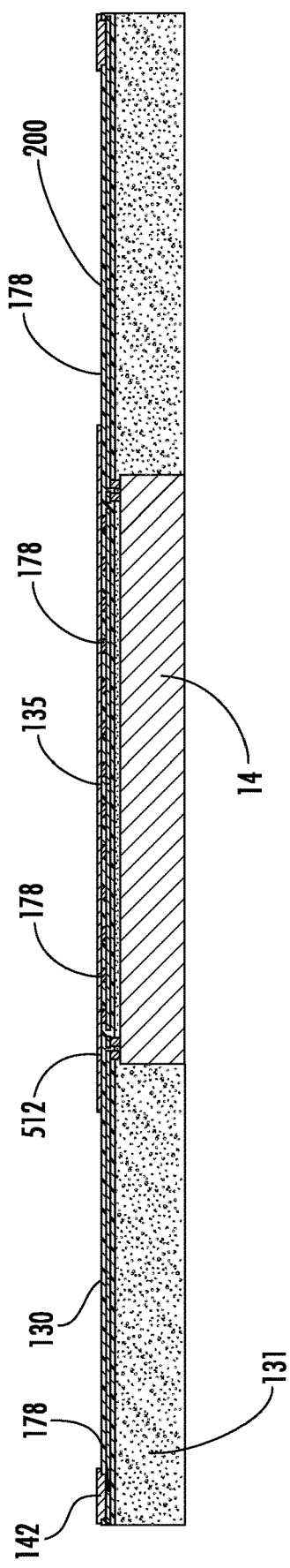
FIG. 7C illustrates an alternative embodiment of a cross-sectional view of a QFN, DFN or SON package formed with two polyimide layers.
Figure 7D:
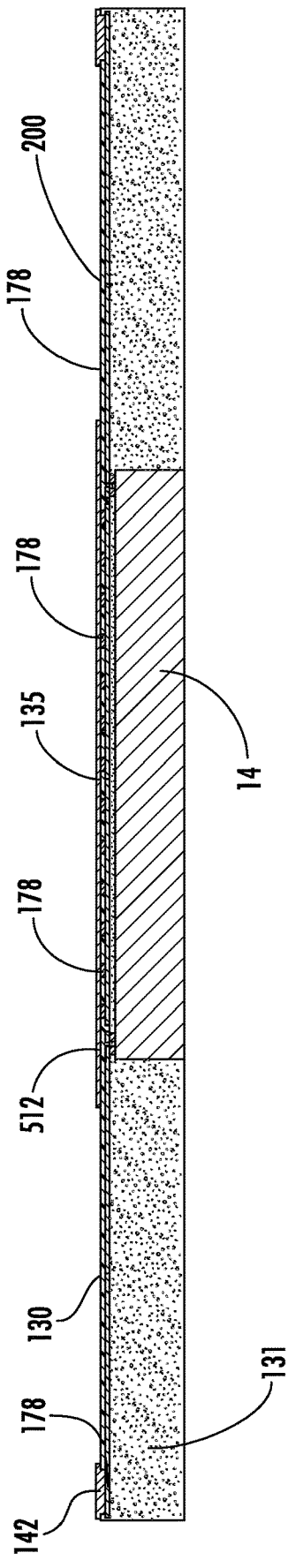
FIG. 7D illustrates a cross-sectional view of a QFN, DFN or SON package like that of FIG. 7C, but formed with one polyimide layer.

FIG. 7C illustrates a QFN, DFN or SON package that includes conductive stumps 178 coupled to the RDL 135 and the die pad 512, but different from other embodiments in this disclosure, includes a first layer of polyimide 200 disposed on a layer of mold compound 131 prior to forming the RDL 135. In this embodiment, a second layer of polyimide 202 is formed over the RDL 135 prior to forming the conductive stumps 178 and conductive pads 142. The QFN, DFN or SON package structure of FIG. 7D is formed like the QFN, DFN or SON package of FIG. 10C, but the RDL 135 is formed over a mold compound 131 layer, and a layer of polyimide 202 is formed on top of the RDL prior to forming the conductive stumps 178 and conductive pads 142.

Figure 8D:
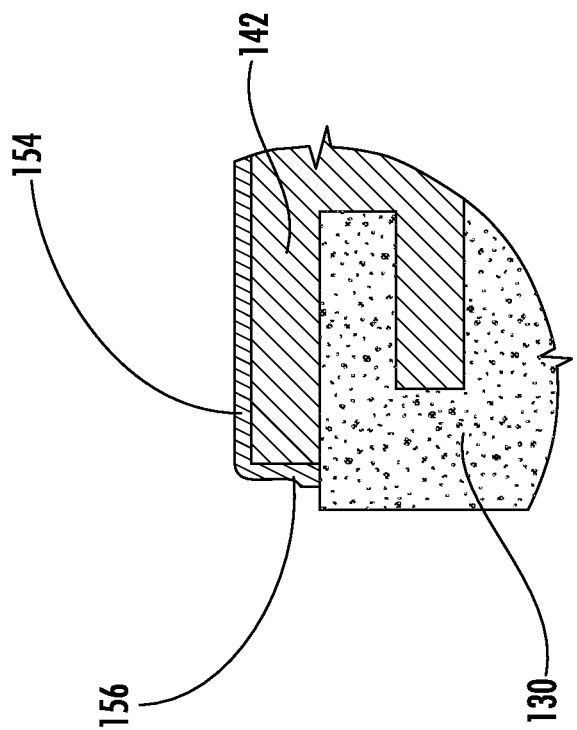
FIG. 8D is a close-up view of a corner of a conductive pad of FIG. 8B comprising SMS with a foot.

FIGS. 8A-8D illustrates that the instant design is improved over the prior art design by having conductive pads 142 that extend beyond the surface of the final encapsulant, and allow for solder to extend around an entirety, a majority, or more than only one edge of the conductive pad 142, providing for a stronger and more robust mechanical connection. FIG. 8A shows a QFN, DFN or SON package 170, manufactured according to an embodiment of the present disclosure, without a leadframe mounted to a PCB 192.

Figure 8C:
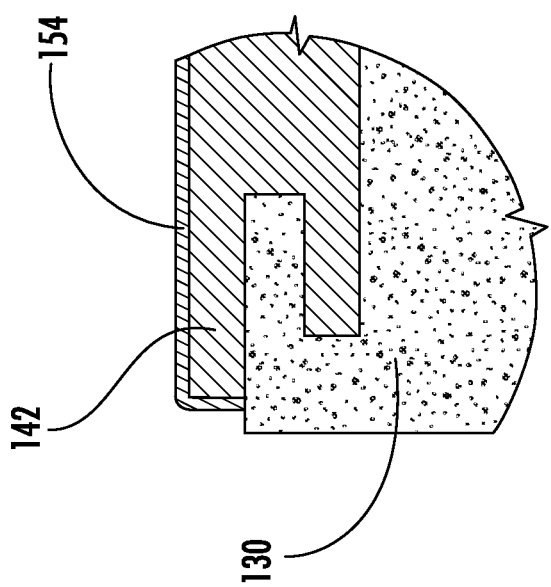
FIG. 8C is a close-up view of a corner of a conductive pad of FIG. 8B comprising SMS without a foot.

FIG. 8B illustrates an enlarged close-up of view of a portion of FIG. 8A identified as section 8A, emphasizing package 170, manufactured according to an embodiment of the present disclosure, with a conductive pad 142 mounted to the PCB 192, such as with solder. FIG. 8C illustrates a close-up view of a corner of a conductive pad similar to that shown in FIG. 8B, formed according to an embodiment of the present disclosure, comprising the solderable metal system (SMS) 154 formed without a foot (such as by electroless plating) before being mounted to a PCB 192 (which may include any other desirable substrate or surface). FIG. 8D, similar to FIG. 8C, illustrate a close-up view of a corner of the conductive pad, formed according to an embodiment of the present disclosure, comprising the SMS 154 formed with a foot 156 (such as by electroplating). Note that in each of the embodiments of FIGS. 8A-8D, an RDL trace 135 is formed on encapsulant 130, such as, without limitation, epoxy mold compound (EMC) or polyimide, and then the same encapsulant material 130, such as EMC or polyimide, is formed on top of the RDL trace 135 prior to the conductive pad 142 being formed over the encapsulant 130 so that a continuous conductive material locks around at least one layer of encapsulant 130. In particular embodiments, at least one layer of encapsulant 130 is locked between, or interlocked with, two layers of a conductive pad 142, for example between the RDL 135 and the conductive pad 142 as illustrated in FIG. 3B. It should be clear that multiple layers of conductive material can be repeated to form a conductive pad 142 so that multiple layers of encapsulant 130 is interlocked between at least three or even more layers of conductive material (see FIG. 3C, for example).

In other embodiments, such as is illustrated in FIG. 3C, more than just two layers of the same kind of encapsulant 130 may be formed, interlocked with layers of a conductive pad 142 so that the conductive layers, beginning with the RDL 135 and ending with the conductive pad 142, regardless of how many layers is used, includes interlocking structures extending into the layers of the same kind of encapsulant 130. In some particular embodiments, instead of EMC, thick mold compound (TMC), or other known mold compound may be used. By interlocking the conductive pad 142 structure with encapsulant 130 layers, particularly of encapsulant 130 layers of the same kind of encapsulant materials, the conductive pads 142 have better adhesion to the encapsulant 130 and a stronger structure is formed.

Figure 9A:
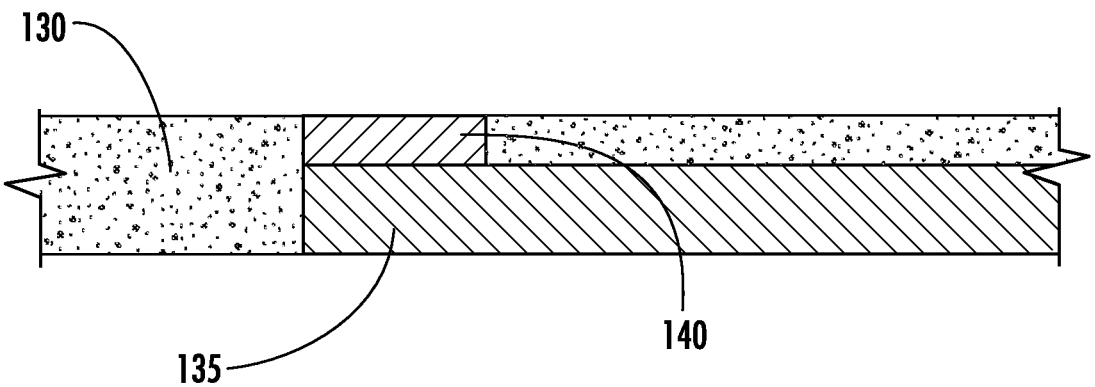
FIG. 9A illustrates a planarized encapsulant surface and conductive stumps.
Figure 9B:
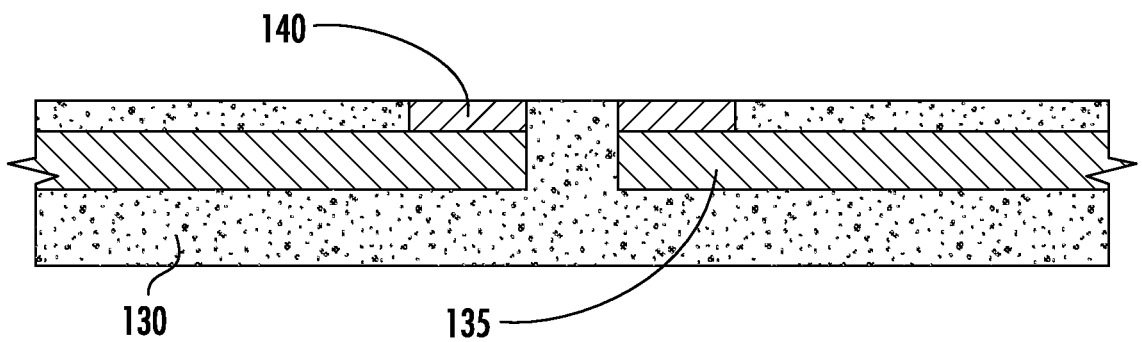
FIG. 9B illustrates edges of two adjacent packages prior to singulation of the package of FIG. 9A.
Figure 9C:
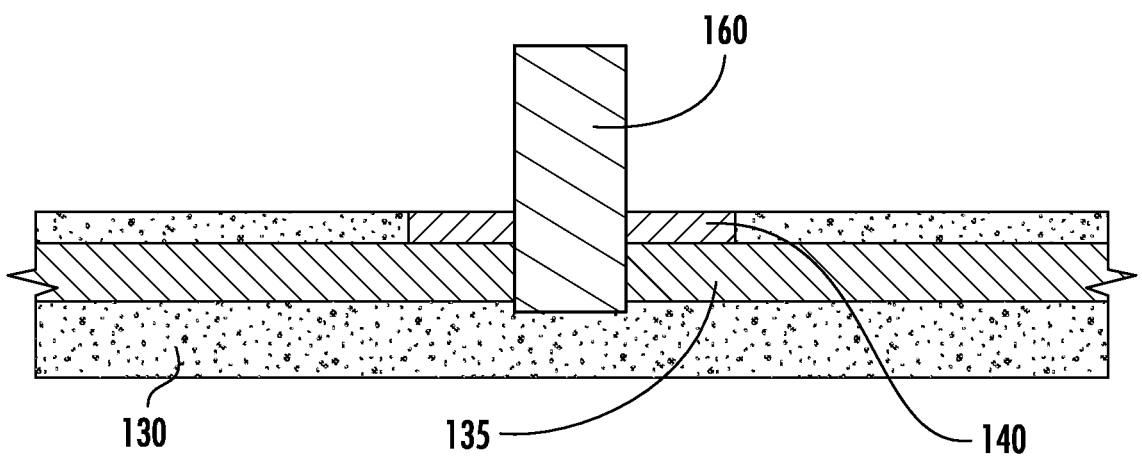
FIG. 9C illustrates a first saw cutting through a portion of the packaging of FIG. 9B.
Figure 9D:
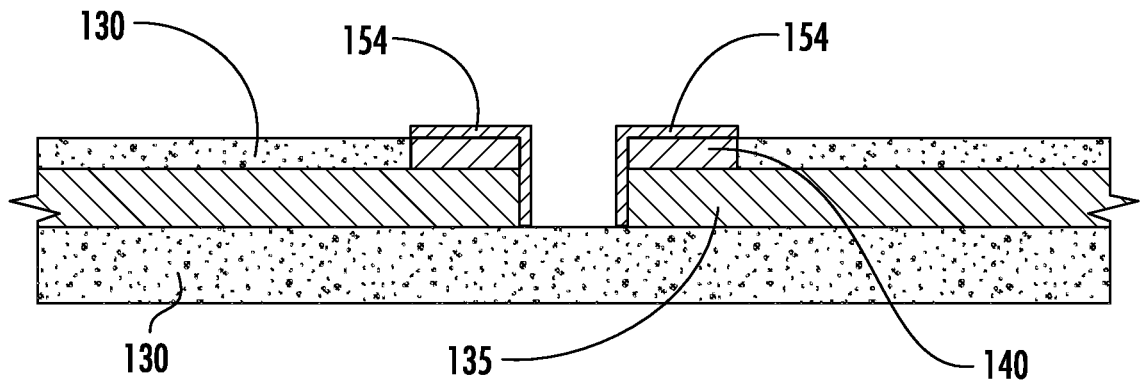
FIG. 9D illustrates an applied SMS on the structure of FIG. 9C.
Figure 9E:
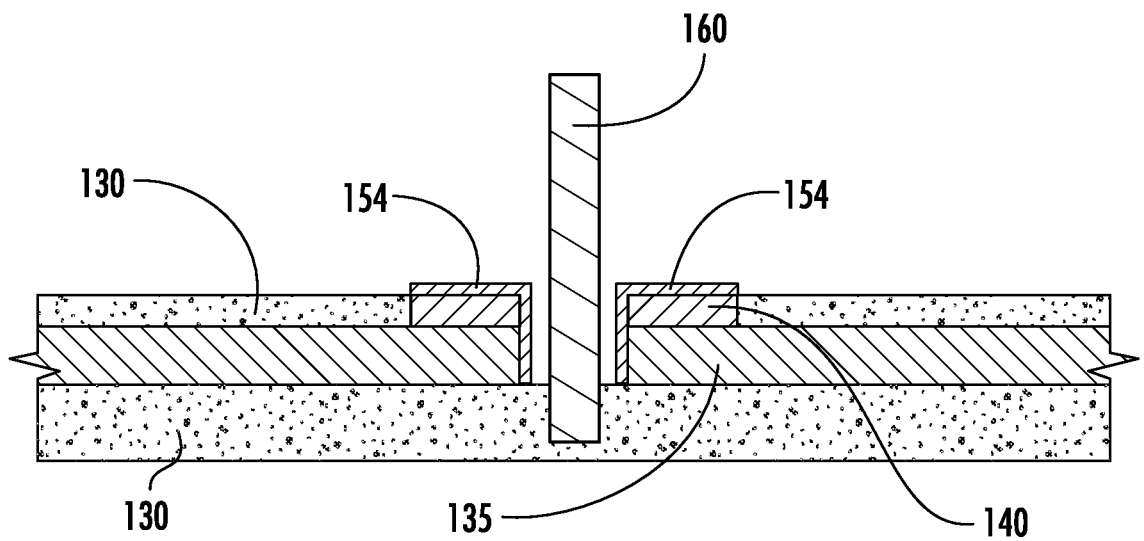
FIG. 9E illustrates a second saw fully singulating the packages of FIG. 9D.
Figure 9F:
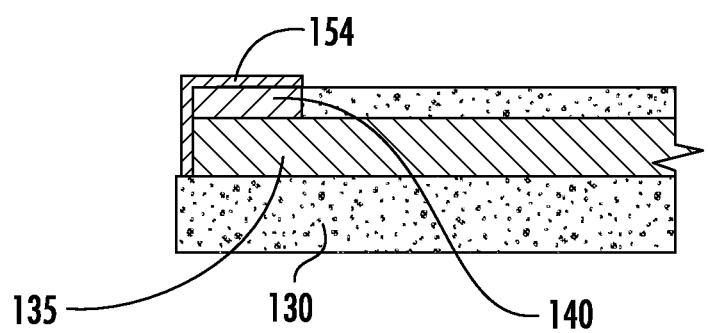
FIG. 9F illustrates the singulated packages of FIG. 9E.

FIGS. 9A-9F illustrate an alternative embodiment of the method of FIGS. 2A-2O beginning at the formation of the vertical conductive contacts 140 at FIG. 2H. In this embodiment, the vertical conductive contacts 140, or conductive stumps 140, are formed to extend substantially coextensive with the RDL 135 (FIG. 9A), and will be used as the conductive pad. FIG. 9B illustrates that the package of FIG. 9A has not been singulated yet and is still part of an interconnected package structure. In FIG. 9C, a first saw 160 cuts between the two adjacent packages along the saw street and trims an edge of the RDL 135 and conductive stumps 140 for each of the two adjacent packages, but does not completely singulate the packages from each other. FIG. 9D illustrates, similar to previously explained in this disclosure, that an SMS layer is disposed over the exposed surfaces of the RDL 135 and conductive stumps 140.

After the SMS 154 is applied, a second saw 161 finishes the cut through the packaging to singulate the packages. The second saw 161, however, is a narrower saw and cuts between the packaging but leaves the SMS 154 over the RDL 135 and conductive stumps 140. The resulting structure, illustrated in FIG. 9F, includes the conductive stump 140 with the SMS 154 covering the conductive stump 140 which can now act as a conductive pad for the package. There are some significant advantages of forming a QFN, DFN or SON package in this way. First, by exposing the RDL 135 and conductive stump 140 along the edge of the package, there is a measurable vertical surface to act as a wettable flank for connecting solder. Additionally, by applying the SMS 154, there is no exposed copper from the RDL or conductive stump 140 on the completed package, so the applied solder has sufficient vertical wettable surface to adhere to and can be clearly verified through top-down AOI.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a quad flat no-lead (QFN), dual flat no-lead (DFN) or small outline no-lead (SON) package without a leadframe, comprising:
    disposing at least two semiconductor chips face-up on a temporary carrier, the at least two semiconductor chips each comprising conductive stumps over an active layer of each of the at least two semiconductor chips;
    disposing a first layer of encapsulant in a single step around four side surfaces of each of the at least two semiconductor chips, over the active layer of each of the at least two semiconductor chips, and around the conductive stumps;
    planarizing the first layer of encapsulant over the active layer of each of the at least two semiconductor chips to create a planar surface comprising exposed ends of the conductive stumps and an exposed encapsulant surface;
    forming a first conductive layer and first vertical conductive contacts over the planar surface and configured to be electrically coupled with the conductive stumps of the at least two semiconductor chips;
    disposing a second layer of encapsulant over the first layer of encapsulant, the first conductive layer and the first vertical conductive contacts;
    forming a first photoresist over the second layer of encapsulant with openings formed through the first photoresist over the first vertical conductive contacts;
    forming conductive pads in the form of land pads or bumps within the openings and then removing the first photoresist;
    forming a second photoresist over the second layer of encapsulant with conductive pad openings formed through the second photoresist over the conductive pads;
    forming a solderable metal system (SMS) or applying an organic solderability preservative (OSP) over the conductive pads to resist oxidation over at least a portion of the conductive pads; and
    cutting through the second layer of encapsulant around at least one of the at least two semiconductor chips to form an outline of a package.

2. The method of claim 1, wherein the SMS is formed by a single layer or multi-material layer build-up of conductive material comprising at least one of a layer of nickel (Ni), a layer of silver (Ag), a layer of palladium (Pd), a layer of tin (Sn), and a layer of gold (Au).

3. The method of claim 1, wherein the SMS is formed as a layer of conductive materials over the conductive pads by one or more of electroplating, electroless plating, immersion plating, physical vapor deposition (PVD), and chemical vapor deposition (CVD).

4. The method of claim 3, wherein forming the conductive pads comprises forming the conductive pads to include at least the second layer of encapsulant locked between the first conductive layer and the conductive pads.

5. The method of claim 4, further comprising forming the QFN, DFN or SON package without exposed copper.

6. The method of claim 4, further comprising forming the QFN, DFN or SON package without exposed copper on a periphery of the QFN, DFN or SON package.

7. The method of claim 3, wherein forming the first conductive layer comprises forming a redistribution layer directly upon an encapsulant surface, and wherein disposing a second layer of encapsulant over the first conductive layer includes disposing the second layer of encapsulant directly upon the redistribution layer, wherein the encapsulant surface and the second layer of encapsulant are of the same kind of encapsulant.

8. The method of claim 7, further comprising forming a flag, mounting pads, identifying mark, alignment marks, or other conductive structure over the at least two semiconductor chips and over the second layer of the encapsulant.

9. The method of claim 8, wherein the conductive pads extends beyond a surface edge of an uppermost encapsulant layer.

10. The method of claim 8, further comprising cutting through the second layer of encapsulant such that an edge or side of the conductive pad is inset from the resulting QFN, DFN or SON package edge.

11. The method of claim 10, wherein the encapsulant of at least one of the first layer of encapsulant and the second layer of encapsulant comprises a mold compound, polyimide or a composite material.

12. The method of claim 11, further comprising forming openings in the second photoresist layer around the conductive pads, the openings in the second photoresist layer each comprising an offset between the conductive pad respective to the openings in the second photoresist layer and an edge of the second photoresist layer.

13. The method of claim 12, further comprising forming at least one of a through mold post and a double-sided circuit trace in the QFN, DFN or SON package.

14. The method of claim 13, further comprising forming additional conductive stumps over the first layer of encapsulant.

15. A method of making a quad flat no-lead (QFN), dual flat no-lead (DFN) or small outline no-lead (SON) package without a leadframe, the method comprising:
  disposing a semiconductor chip face-up on a temporary carrier, the semiconductor chip comprising conductive stumps over an active layer of the semiconductor chip;
  disposing encapsulant in a single step around four side surfaces of the semiconductor chip, over the active layer of the semiconductor chip, and around at least a portion of sidewalls of the conductive stumps;
  planarizing a surface of the encapsulant and conductive stumps;
  forming conductive traces over the encapsulant;
  forming conductive pads over the encapsulant in the form of land pads or bumps; and
  forming a solderable metal system (SMS) or applying an organic solderability preservative (OSP) over the conductive pads to resist oxidation over at least a portion of the conductive pads;
    wherein the QFN, DFN or SON package includes no solder balls.

16. The method of claim 15, wherein the SMS is formed by, electroplating, electroless plating, immersion plating, physical vapor deposition (PVD), or chemical vapor deposition (CVD), of conductive materials over the conductive pads.

17. The method of claim 15, wherein forming conductive traces on the encapsulant comprises forming a redistribution layer directly upon an encapsulant surface, and further comprising disposing encapsulant directly upon the redistribution layer, wherein the encapsulant disposed in the single step and the encapsulant disposed directly upon the redistribution layer are of the same kind of encapsulant.

18. The method of claim 15, wherein each conductive pad includes at least one layer of encapsulant locked between at least two layers of conductive material.

19. The method of claim 15, wherein each conductive pad includes at least two layers of encapsulant interlocked between at least three layers of conductive material.

20. The method of claim 15, wherein the SMS is formed by a single layer or multi-material layer build-up of conductive material comprising at least one of a layer of nickel (Ni), a layer of silver (Ag), a layer of palladium (Pd), a layer of tin (Sn), and a layer of gold (Au).

21. The method of claim 15, further comprising forming a flag, mounting pads, identifying mark, alignment marks, or other conductive structure over the semiconductor chip and over the encapsulant.

22. The method of claim 15, wherein the conductive pads extends beyond the encapsulant's surface.

23. The method of claim 15, further comprising forming openings in a second photoresist layer around the conductive pads, the openings comprising an offset between the conductive pads and an edge of the second photoresist layer.

24. The method of claim 15, further comprising forming the QFN, DFN or SON package without exposed copper.

25. The method of claim 15, further comprising forming the QFN, DFN or SON package without exposed copper on a periphery of the QFN, DFN, or SON package.

26. The method of claim 15, further comprising forming additional conductive stumps over the surface of the encapsulant.

27. The method of claim 15, further comprising forming at least one of a through mold post and a double-sided circuit trace in the QFN, DFN or SON package.

28. The method of claim 15, further comprising forming a plurality of dummy thermal conductive stumps over the active layer of the semiconductor chip and thermally coupling the dummy thermal conductive stumps with a thermally dissipative layer on the QFN, DFN or SON package.

29. A method of making a quad flat no-lead (QFN), dual flat no-lead (DFN) or small outline no-lead (SON) package without a leadframe, the method comprising:
  disposing a semiconductor chip face-up on a temporary carrier, the semiconductor chip comprising conductive stumps over an active layer of the semiconductor chip;
  disposing encapsulant in a single step around four side surfaces of the semiconductor chip, over the active layer of the semiconductor chip, and around at least a portion of sidewalls of the conductive stumps;
  planarizing a surface of the encapsulant and conductive stumps;
  forming conductive traces over the encapsulant;
  forming conductive pads over the encapsulant in the form of land pads or bumps; and
  forming a solderable metal system (SMS) or applying an organic solderability preservative (OSP) over the conductive pads to resist oxidation over at least a portion of the conductive pads; and
  cutting through the encapsulant such that an edge or side of the conductive pads is inset from a resulting QFN, DFN or SON package edge.

* * * * *